US009247658B2

(12) United States Patent
McWilliams, Jr. et al.

(10) Patent No.: US 9,247,658 B2
(45) Date of Patent: Jan. 26, 2016

(54) LOCKING ENCLOSURE, STIFFENING RING, AND VERTICAL MOUNTING STIFFENERS FOR SECURING COMPONENTS

(71) Applicant: Integra Enclosures LLC, Mentor, OH (US)

(72) Inventors: James C. McWilliams, Jr., West Chester, OH (US); Christopher Brizes, Westlake, OH (US)

(73) Assignee: INTEGRA ENCLOSURES LLC, Mentor, OH (US)

( * ) Notice: Subject to any disclaimer, the term of this patent is extended or adjusted under 35 U.S.C. 154(b) by 0 days.

(21) Appl. No.: 13/767,517

(22) Filed: Feb. 14, 2013

(65) Prior Publication Data
US 2013/0228571 A1    Sep. 5, 2013

Related U.S. Application Data

(63) Continuation-in-part of application No. 13/207,081, filed on Aug. 10, 2011.

(51) Int. Cl.
*H02G 3/08* (2006.01)
*B65D 1/42* (2006.01)
*B65D 90/02* (2006.01)
*B65D 85/00* (2006.01)
*B65D 23/12* (2006.01)
(Continued)

(52) U.S. Cl.
CPC .. *H05K 5/02* (2013.01); *H02B 1/48* (2013.01); *H05K 7/18* (2013.01)

(58) Field of Classification Search
CPC .............. H02G 3/08; B65D 1/42; B65D 6/34; B65D 8/04; B65D 8/08; B65D 8/18; B65D 90/02; B65D 85/00; B65D 23/12; B65D 81/07; A47B 81/00; A47B 97/00; E05C 3/16; E05C 5/00; E05C 5/02; H05K 5/0004; H05K 5/0008; H05K 7/18; H05K 7/183
USPC .......... 220/3.3, 651, 652, 653, 654, 668, 324; 206/708, 722; 312/223.1
See application file for complete search history.

(56) References Cited

U.S. PATENT DOCUMENTS 3,183,863 A  *  5/1965  Jeffres ......................... 109/59 R
4,691,970 A  *  9/1987  Neri ........................... 312/265.5
(Continued)

*Primary Examiner* — Fenn Mathew
*Assistant Examiner* — Andrew T Kirsch
(74) *Attorney, Agent, or Firm* — Tucker Ellis, LLP; Patrick Clunk; Michael Hudzinski

(57) ABSTRACT

A latchable enclosure in the form of a box having a base, four sidewalls, and an open top face which may be closed by a cover plate or lid over its open top for covering components stored in the enclosure. The enclosure may be stiffened by providing a removable or permanent stiffening ring around the inside surface of the open top. This stiffening ring may also provide locations for attachment of components or mounting tracks. The enclosure may also include vertical mounting stiffeners that act to further increase the stiffness of the enclosure while also acting as mounting tracks for direct or indirect (through separate mounting brackets) attachment of components. The vertical mounting stiffeners may include a plurality of holes for said attachment.

13 Claims, 25 Drawing Sheets

(51) Int. Cl.
*B65D 81/07* (2006.01)
*B65D 6/34* (2006.01)
*B65D 8/08* (2006.01)
*B65D 8/18* (2006.01)
*B65D 45/16* (2006.01)
*A47B 81/00* (2006.01)
*H05K 5/00* (2006.01)
*H05K 5/02* (2006.01)
*H02B 1/48* (2006.01)
*H05K 7/18* (2006.01)

(56) References Cited

U.S. PATENT DOCUMENTS

| | | |
|---|---|---|
| 5,020,866 A | 6/1991 | McIlwraith |
| 6,036,290 A | 3/2000 | Jancsek et al. |
| 6,469,247 B1 | 10/2002 | Dodds et al. |
| 6,516,955 B1 | 2/2003 | Dudhwala et al. |
| 2002/0153814 A1* | 10/2002 | Robideau .................. 312/265.4 |

* cited by examiner

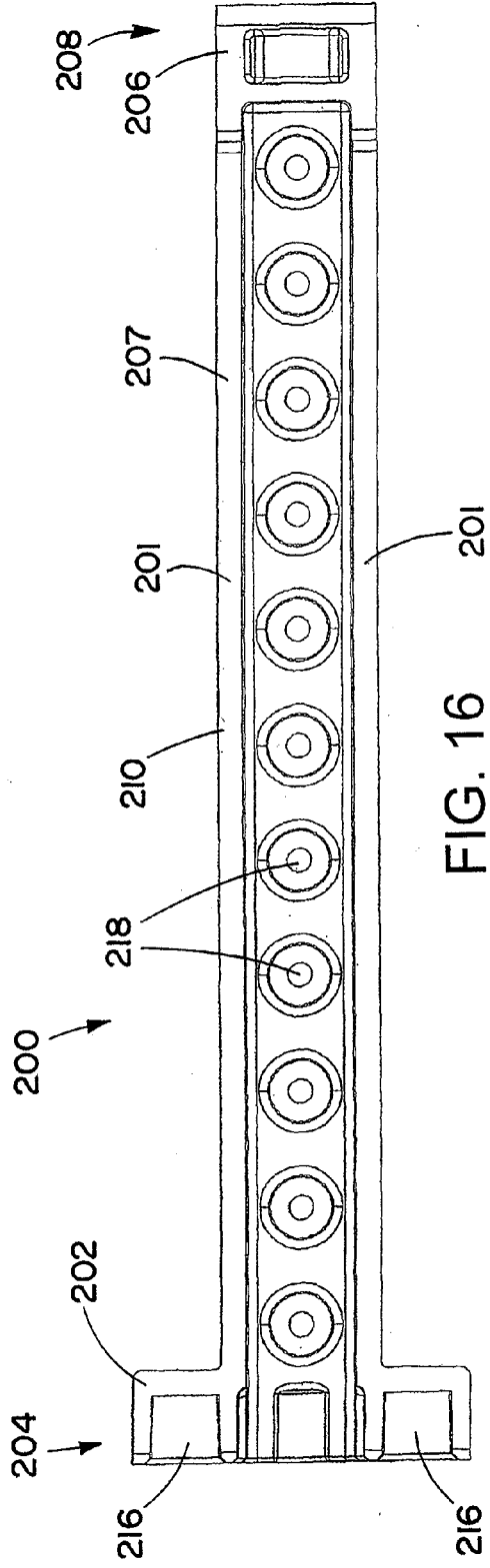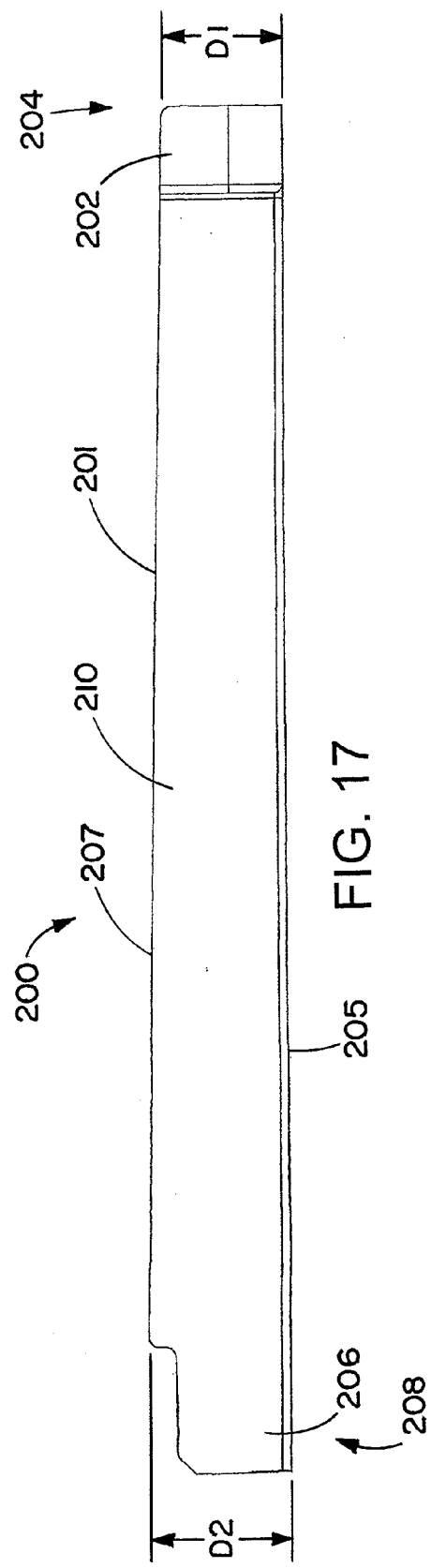

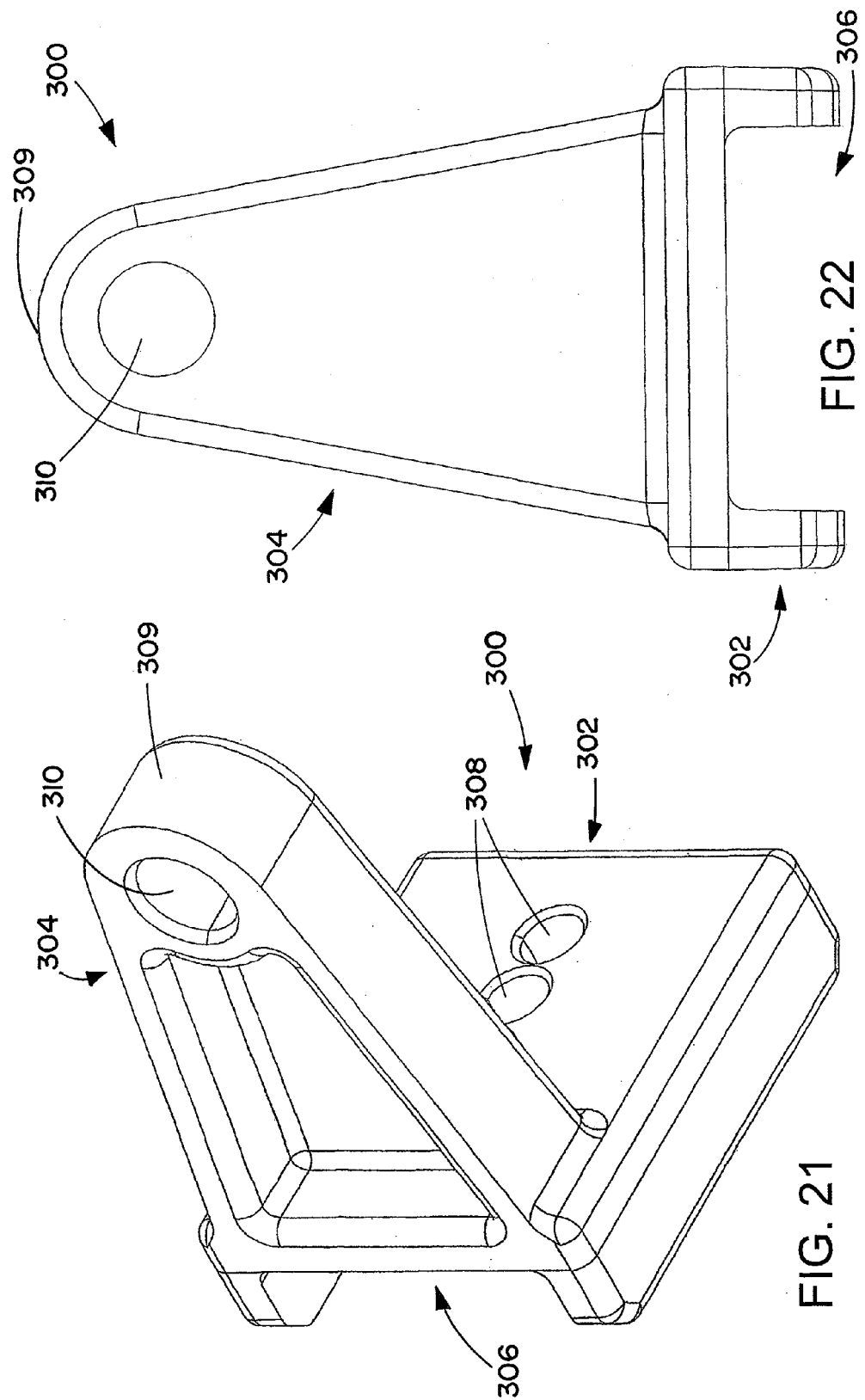

LOCKING ENCLOSURE, STIFFENING RING, AND VERTICAL MOUNTING STIFFENERS FOR SECURING COMPONENTS

RELATED APPLICATIONS

This application is a continuation-in-part of U.S. patent application Ser. No. 13/207,081 filed Aug. 10, 2011, which is hereby incorporated herein by reference.

TECHNICAL FIELD OF THE INVENTION

The present invention concerns an enclosure for securing components such as electronic and/or electric components and, more particularly, an enclosure including a customizable and integrated locking mechanism for the enclosure.

BACKGROUND

Enclosures are commonly used to provide a degree of protection to personnel against incidental contact with enclosed equipment and to provide a degree of protection against the surrounding environment for enclosed equipment. Typical enclosures include a box and a door sealed thereto. Frequent access to the components within such enclosures is common for adjustments, maintenance, and inspection of the components. Components within the enclosure may also be changed or replaced as the demand therefor changes. Typically, the components are fastened to a panel inside the enclosure. Panels and components must typically be dismounted from the interior of the enclosure and replaced by other components. Further, enclosures are often used to house many different electronic and/or electric components and their associated wiring and control circuitry. These components, their associated wiring, and the panels all come in varying shapes and sizes. Still further, the components must be fastened in place and often several different components must be mounted rigidly in the same housing and/or in a fixed spatial relationship. Therefore flexibility in component placement is important.

Oftentimes, the total production run of any one particular combination of components is somewhat limited and the cost of producing a custom enclosure is not economically justified. In such instances, enclosures having an ability to be adapted to different component mounting arrangements are used. Similarly, when performing field installation of various electrical wiring and control systems, it is often necessary to install many different combinations of components. In order to maintain the number of different enclosures required to a reasonable level, it is desirable to have enclosures which are extremely flexible in that they are able to accommodate a wide variety of components and mounting arrangements.

Some prior art enclosures include means to accommodate multiple components and mounting arrangements yet suffer from a number of drawbacks. For example, an enclosure in the shape of a box may include one or more tracks which extend from the bottom to the top of the enclosure. Mounting brackets which hold electrical components or the like may be slid to and fro along the track until a desired position is attained. A tool may then be inserted through a front face of the enclosure to access one or more fasteners positioned at right angles to the side walls of the enclosure and which, when tightened, engage the side wall to secure the bracket to the track.

Another undesirable aspect of such mounting structure is that the fastener engages the side wall behind the track. The side wall usually consists of a relatively flat panel structure and the force exerted thereon by the fastener is a point or concentrated source at right angles. Consequently, the fastener, when engaging the respective side wall, affects, at least partially, the structural integrity of the side wall, especially over time whereby components may be repeatedly repositioned, requiring the fasteners to be repeatedly repositioned and retightened into the side wall. In addition, the structure may be relatively flimsy, even without this added problem, when exposed to forces in certain directions. Therefore, it is desirable to increase the strength or rigidity of the enclosures. Of course, the thickness of the side walls may be increased to better withstand the effects of the engaging fasteners, but this increased thickness results in higher material and manufacturing costs.

SUMMARY

Broadly, the present application provides a latchable enclosure in the form of a box. The box has a base, four sidewalls, and an open top face which may be closed by a locking cover plate or lid over its open top.

The enclosure may be stiffened by providing a removable or permanent stiffening ring around the inside surface of the open top. This stiffening ring may also provide locations for attachment of components or mounting tracks.

The enclosure may also include vertical mounting stiffeners that act to further increase the stiffness of the enclosure while also acting as mounting tracks for direct or indirect (through separate mounting brackets) attachment of components. The vertical mounting stiffeners may include a plurality of holes for said attachment thus allowing a plurality of components to be attached at various locations along each vertical mounting stiffener. Further, a plurality of vertical mounting stiffeners may be disposed around the perimeter of the enclosure at a variety of locations, thus allowing substantial flexibility in component placement.

Finally, the enclosure may include mounting brackets with a series of closely spaced holes for attachment to mounting tracks. The closely space holes allow for very fine adjustments in the location of the bracket on a track. Further, the mounting brackets may include a channel for slidably engaging a mounting track, thus preventing or minimizing twisting motion of the mounting bracket.

In one aspect of the invention, an enclosure assembly for enclosing electrical components includes a body including a base and a plurality of sidewalls; a cover; one or more vertical mounting stiffeners coupled to the body and comprising a main shaft including a plurality of generally parallel spaced horizontal apertures configured to receive fasteners for mounting components thereon, a platform extending laterally outward from the main shaft and including one or more vertical platform apertures configured to receive a fastener, and a head including a vertical head aperture configured to receive a fastener; and one or more latches in combination with one or more of the vertical mounting stiffeners and adjacent to the cover. The one or more vertical mounting stiffeners are rigid, thereby providing structural support when coupled to the body. The cover includes respective locking members movable to engage with the one or more latches for locking the cover to the body.

Features that are described and/or illustrated with respect to one embodiment may be used in the same way or in a similar way in one or more other embodiments and/or in combination with or instead of the features of the other embodiments.

It should be emphasized that the term "comprises/comprising" when used in this specification is taken to specify the presence of stated features, integers, steps or components but does not preclude the presence or addition of one or more other features, integers, steps, components or groups thereof.

BRIEF DESCRIPTION OF THE DRAWINGS

FIG. 16 is an orthographic back view illustrating an exemplary vertical mounting stiffener in accordance with aspects of the present invention.

FIG. 17 is an orthographic side view illustrating an exemplary vertical mounting stiffener in accordance with aspects of the present invention.

FIG. 21 is an isometric diagram illustrating an exemplary mounting bracket in accordance with aspects of the present invention.

FIG. 22 is an orthographic bottom view illustrating an exemplary mounting bracket in accordance with aspects of the present invention.

DETAILED DESCRIPTION OF EMBODIMENTS

Figure 1:
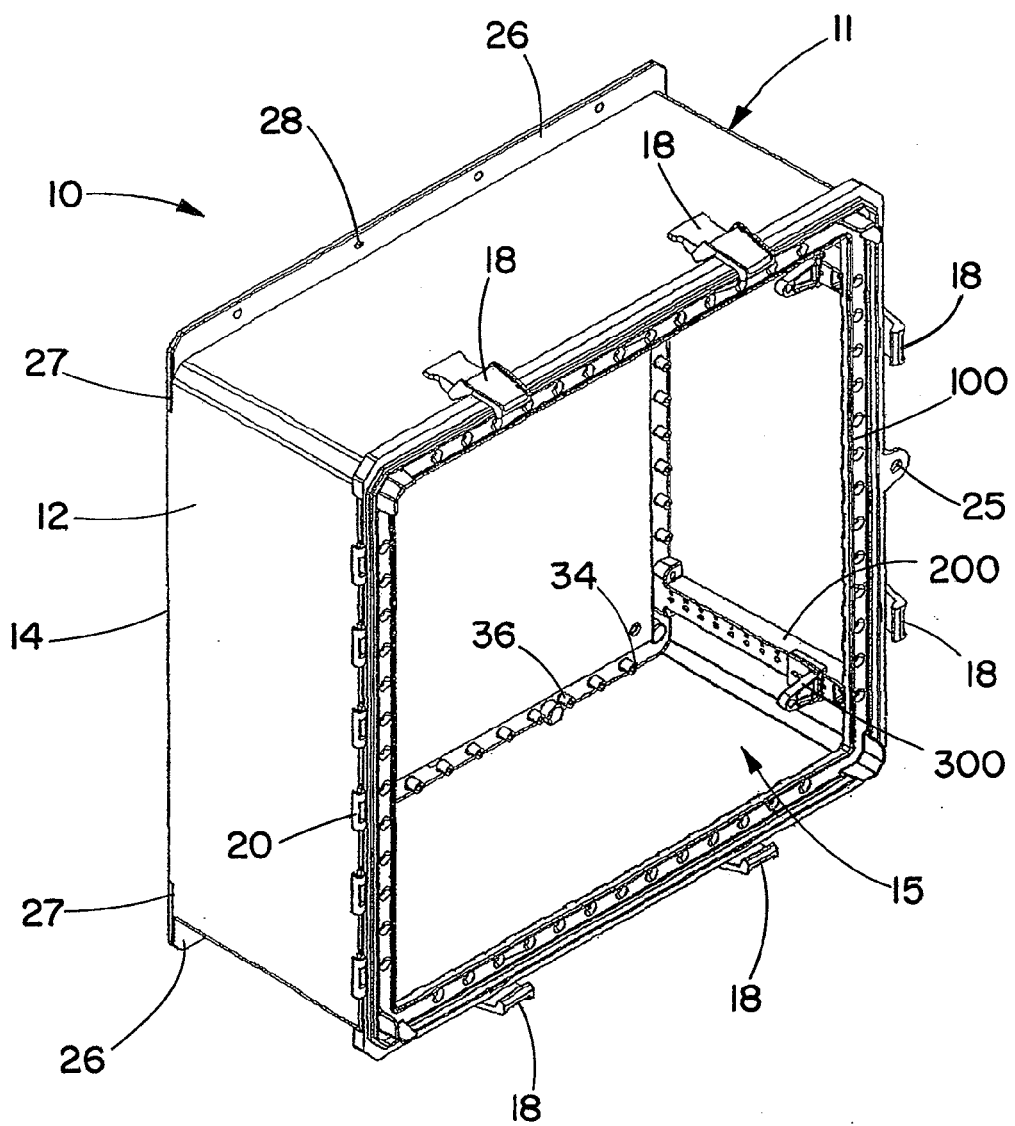
FIG. 1 is an isometric diagram illustrating an exemplary enclosure assembly with the door removed in accordance with aspects of the present invention.
Figure 2:
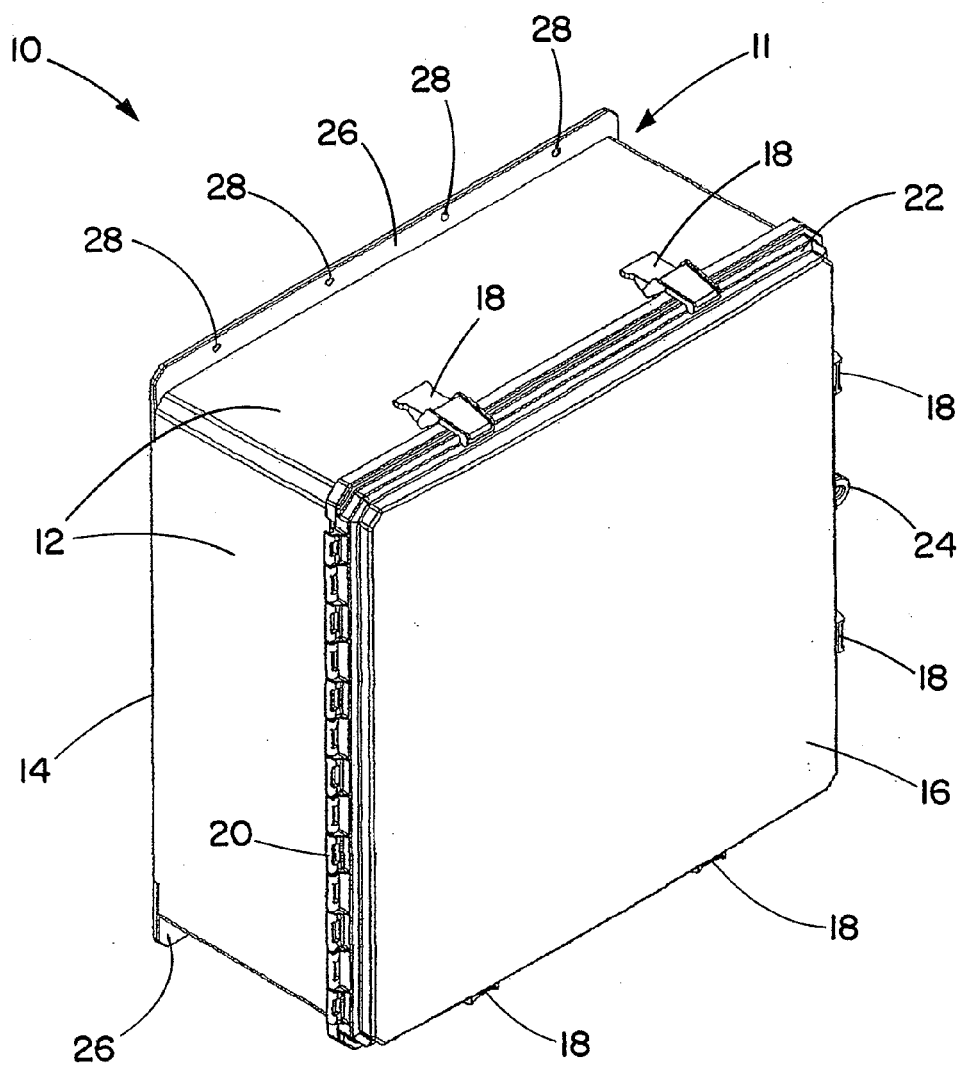
FIG. 2 is an isometric diagram illustrating an exemplary enclosure assembly with the door closed in accordance with aspects of the present invention.
Figure 3:
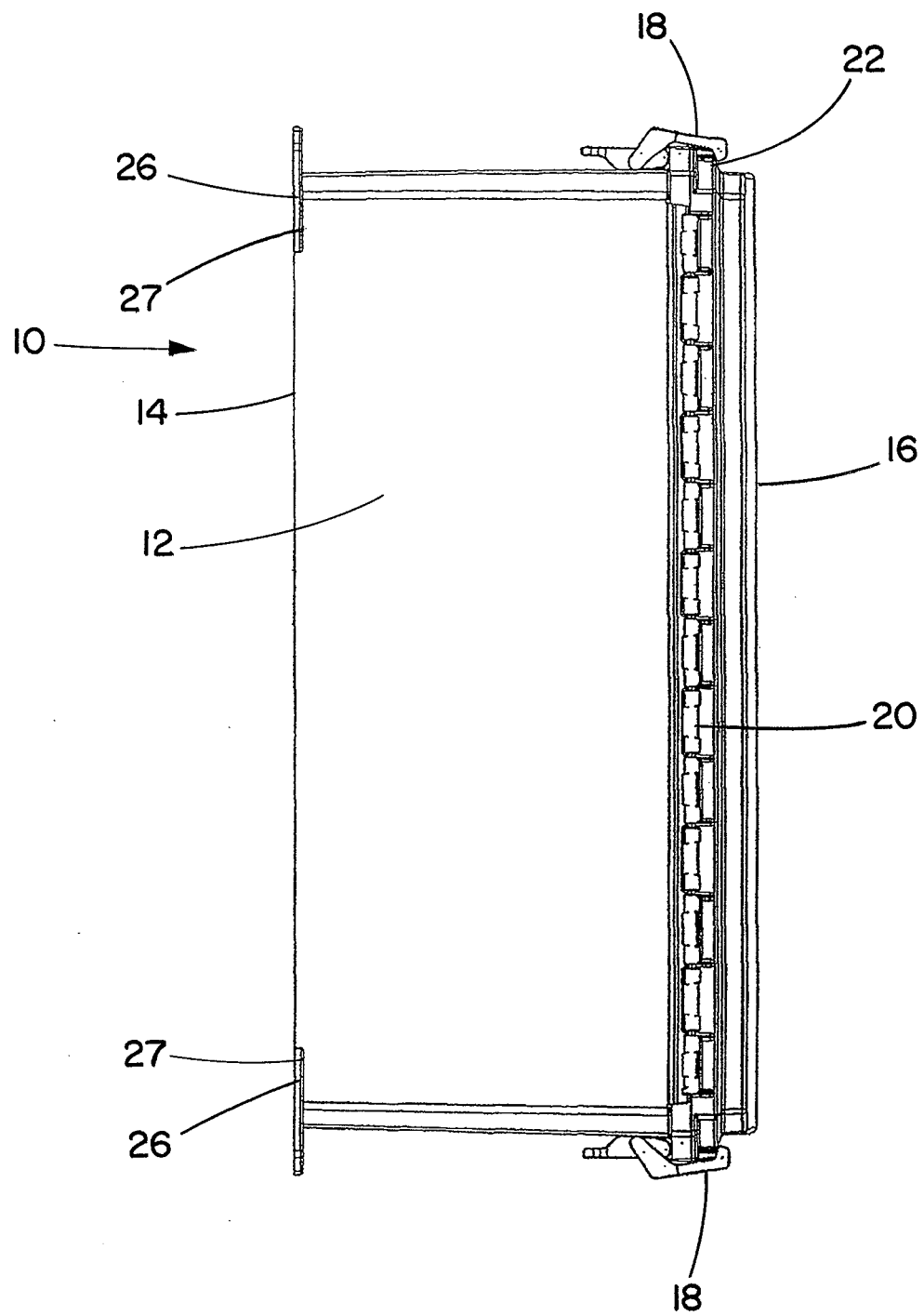
FIG. 3 is an orthographic side view illustrating an exemplary enclosure assembly in accordance with aspects of the present invention.
Figure 4:
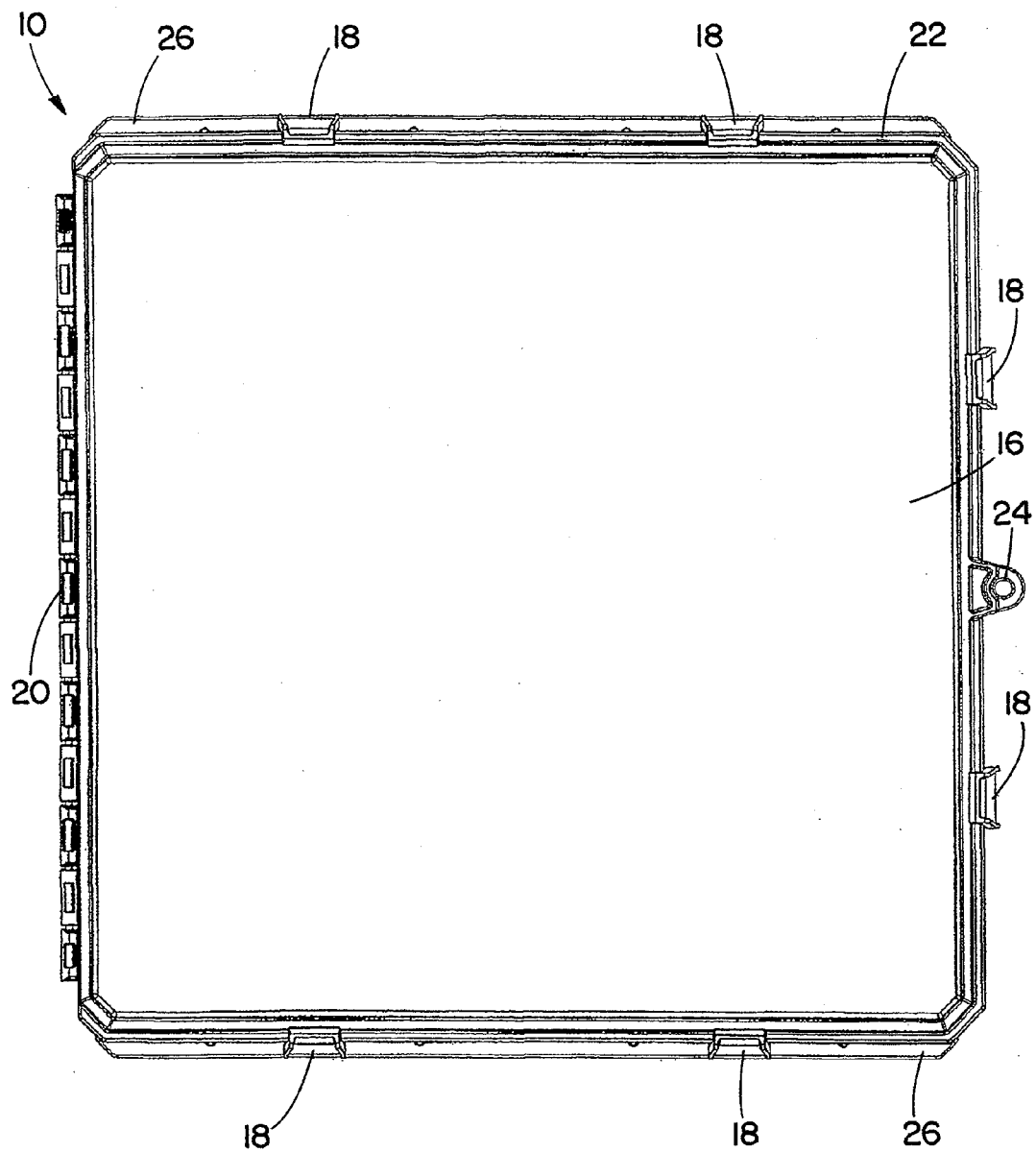
FIG. 4 is an orthographic top view illustrating an exemplary enclosure assembly in accordance with aspects of the present invention.
Figure 5:
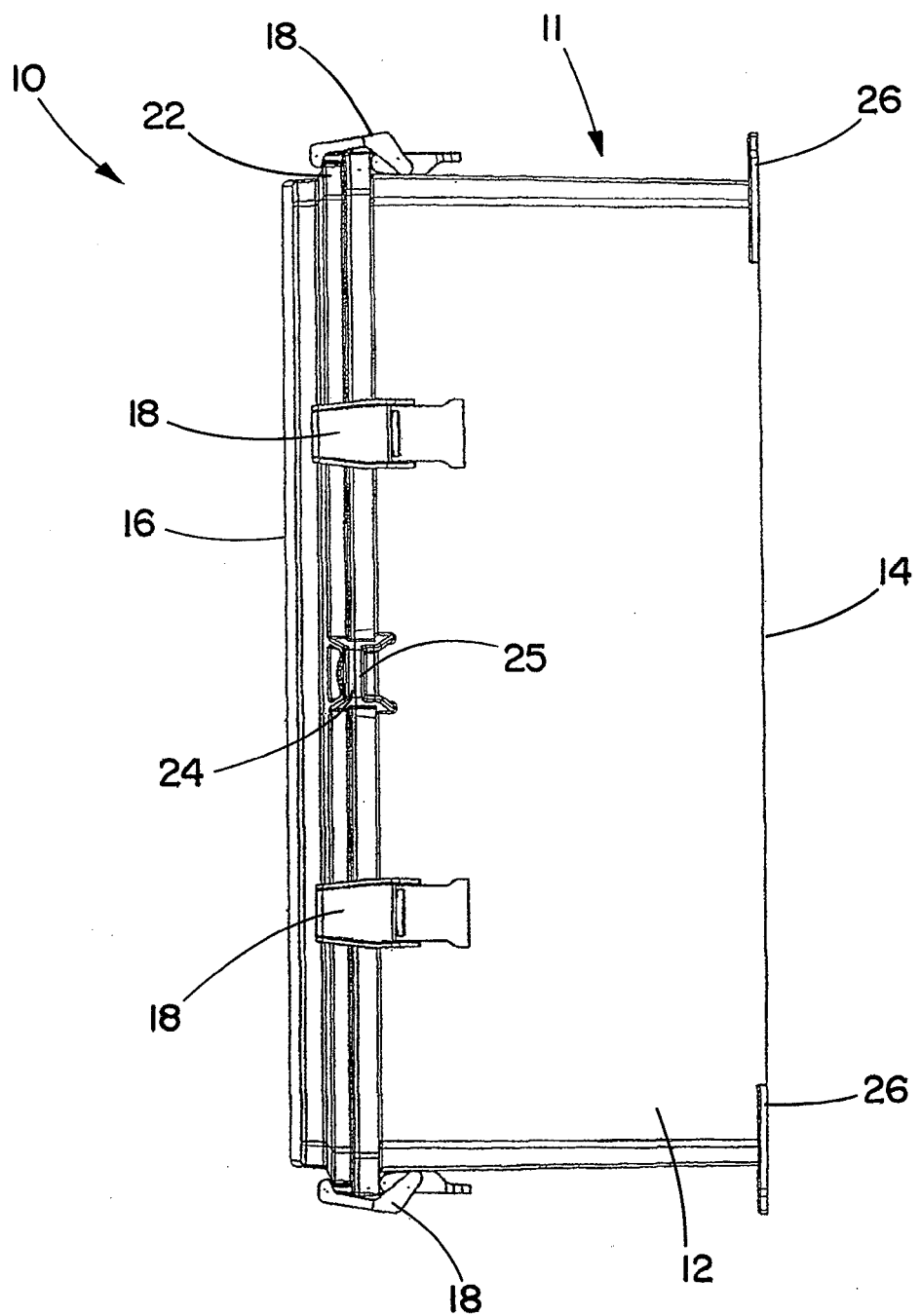
FIG. 5 is an orthographic side view illustrating an exemplary enclosure assembly in accordance with aspects of the present invention.
Figure 6:
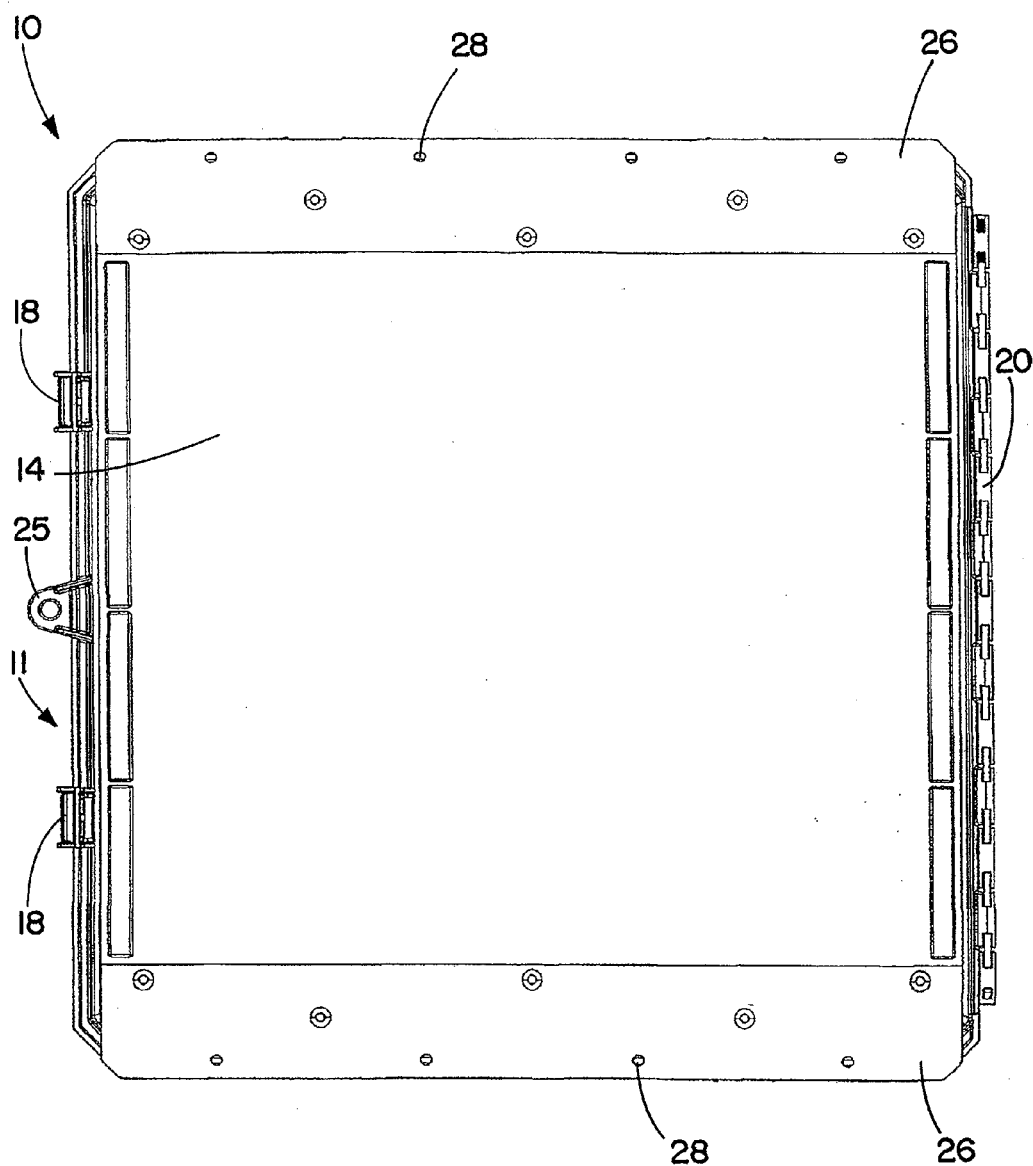
FIG. 6 is an orthographic bottom view illustrating an exemplary enclosure assembly in accordance with aspects of the present invention.

The present invention will now be described with reference to the drawings, wherein like reference numerals are used to refer to like elements throughout. The terms "vertical" and "horizontal" along with any other directional terminology are used herein in reference to an enclosure having sidewalls disposed on the "sides" and having a door facing "up" and a base facing "down." The installed orientation of the box may be different from this illustrative description without departing from the concepts taught herein.

The present invention may be utilized in a variety of contexts including, for example, junction boxes and cut-out boxes designed for use in electrical construction, water treatment, car wash, telecommunication, instrumentation, utilities, machine buildings, HVAC applications, and the like.

FIG. 1 shows an exemplary electrical enclosure 10 assembly in accordance with the present invention. The enclosure 10 may include a body 11 defined by a plurality of sidewalls 12 (preferably four sidewalls 12), and a base 14. The sidewalls 12 define an opening 15. Around this opening 15, a generally annular stiffening ring 100 may be used to support the sidewalls 14 and/or to locate, attach, and support vertical mounting stiffeners 200. Further, mounting brackets 300, 300' may be used to secure electrical and/or other components to the vertical mounting stiffeners 200.

Turning now to FIGS. 2-6, the enclosure 10 may include a top cover or door 16 attached to the body 11 by one or more latches 18 and/or by one or more hinges 20, which may cover the opening 15 when the door 16 is in a closed position.

The door 16 may be attached using any fastening system known to one skilled in the art. The door may include, for example, one or more grooves or steps 22 which provide an attachment surface for the latches 18. The latches may, for example, be unitarily molded and utilize elastic deformation of the fastener to allow movement for engaging and disengaging with the attachment surfaces, as is known in the art. Alternatively, for example, the latches 18 may include separate hinge and latching mechanisms known by one skilled in the art.

Additionally, the door 16 may be attached to one of the sidewalls 12 by one or more hinges 20 allowing the door 16 to pivot between an open position and a closed position. When in an open position, the hinge 20 allows the door 16 to move out of the way of the opening 15, while remaining fixed to the body 11 to, for example, prevent loss of the door 16 or present, to a user, information affixed to the inside of the door, for example, a schematic (not shown) illustrating the contents of the enclosure 10.

Further, the door 16 may include a door lock aperture 24 for securing the door 16 to the body 11 in a closed position with a lock (not pictured) which may pass through the door lock aperture 24 and a complimentary, juxtaposed body lock aperture 25.

Still further, the door 16 and/or the mating surfaces of the body 11 may include a groove (not shown) for receiving a sealing member (not shown) for sealing the door 16 against the body 11 in order to further protect the enclosed components from the outside environment.

As shown in FIGS. 1-6, the enclosure 10 may include one or more mounting plates 26 either formed integral with the body 11 or formed separately and attached to the body 11, for example, by mechanically fastening (with, e.g., bolts or integrally formed protrusions (not shown) extending from the base 14 of the body 11) the mounting plates 26 to channels 27 formed in the base 14. The mounting plates 26 may include one or more mounting holes 28 sized to accept mounting bolts, screws, or other fasteners for securing the enclosure 10 to a surface (not shown), for example, a wall. Alternatively, for example, the mounting plates 26 may be configured for attachment to an intermediate or specialized holder (not shown) to allow quick removal of the enclosure from the mounting surface. Additionally or alternatively, the enclosure 10 may be fixed to a mounting surface by, for example, an adhesive.

Finally, the body 11 may include one or more orifices (not shown) for various purposes. For example, one or more orifices may be provided for drainage purposes. Further, one or more orifices may be provided for allowing wires or conduit to pass into or out of the enclosure 10.

It is preferred but not necessary that the enclosure 10 be made by an injection molding technique from, for example, a thermoplastic. As is often the case in such manufacturing, the various sidewalls 12 of the enclosure 10 may be created with a slight draft angle to permit the enclosure 10 to be easily ejected from the mold. Alternatively, for example, the enclosure may be made from a folded sheet-metal.

Figure 7:
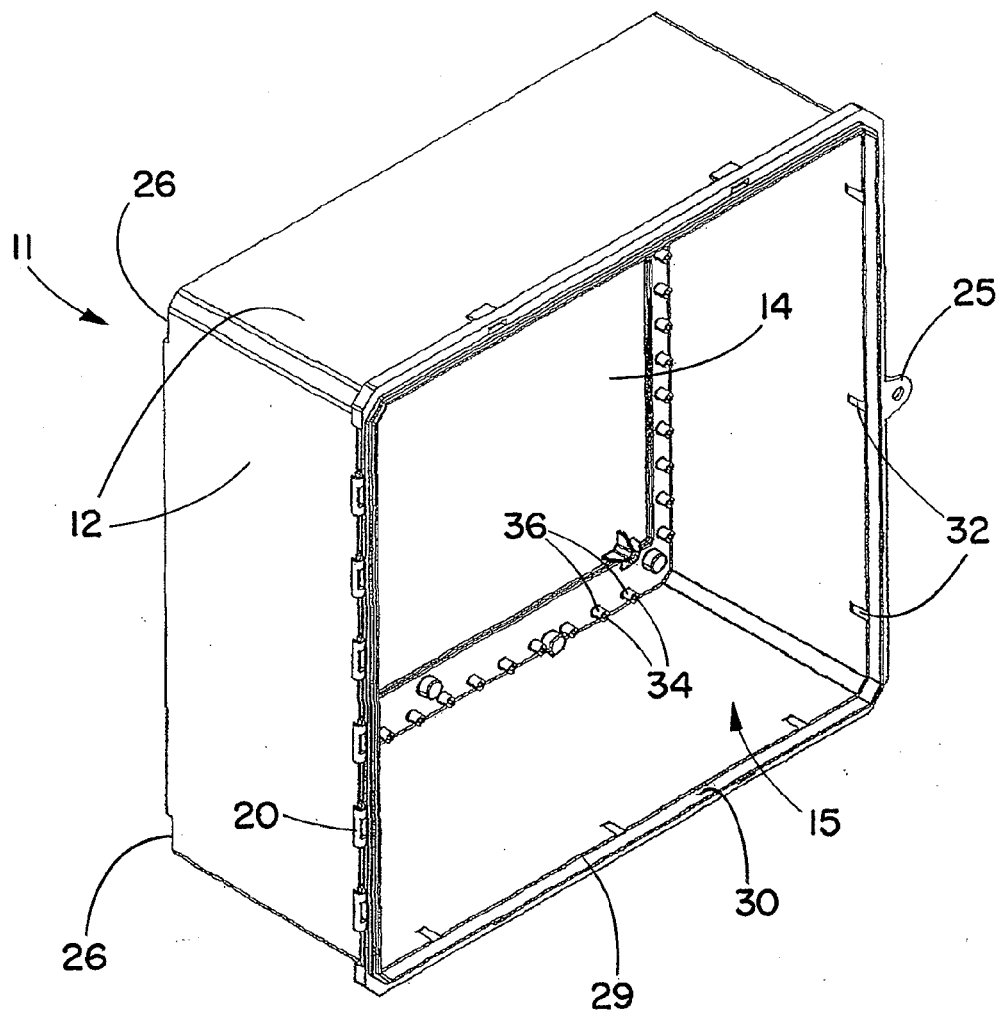
FIG. 7 is an isometric diagram illustrating an exemplary enclosure body in accordance with aspects of the present invention.
Figure 8:
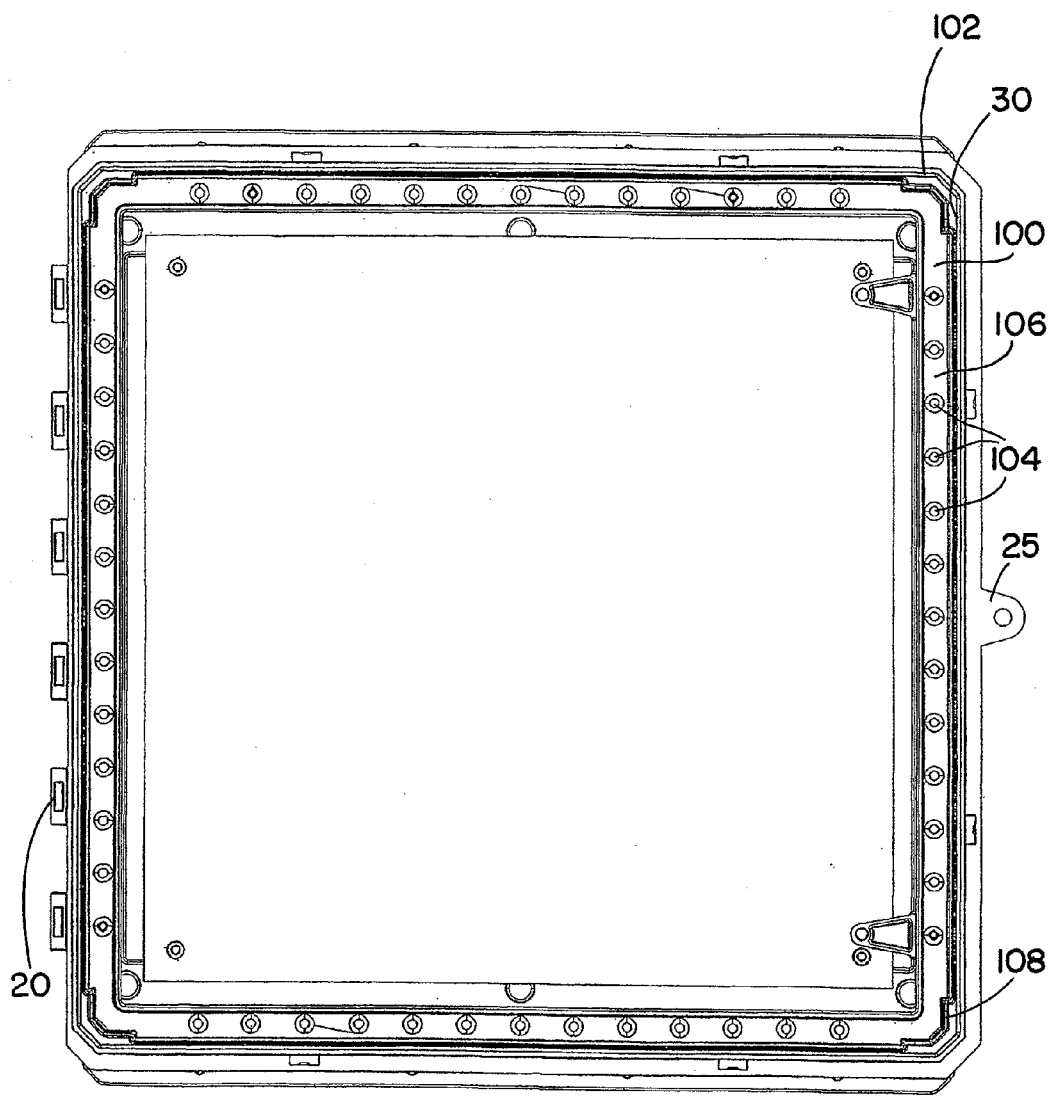
FIG. 8 is an orthographic top-view illustrating an exemplary enclosure assembly with the door removed in accordance with aspects of the present invention.
Figure 9:
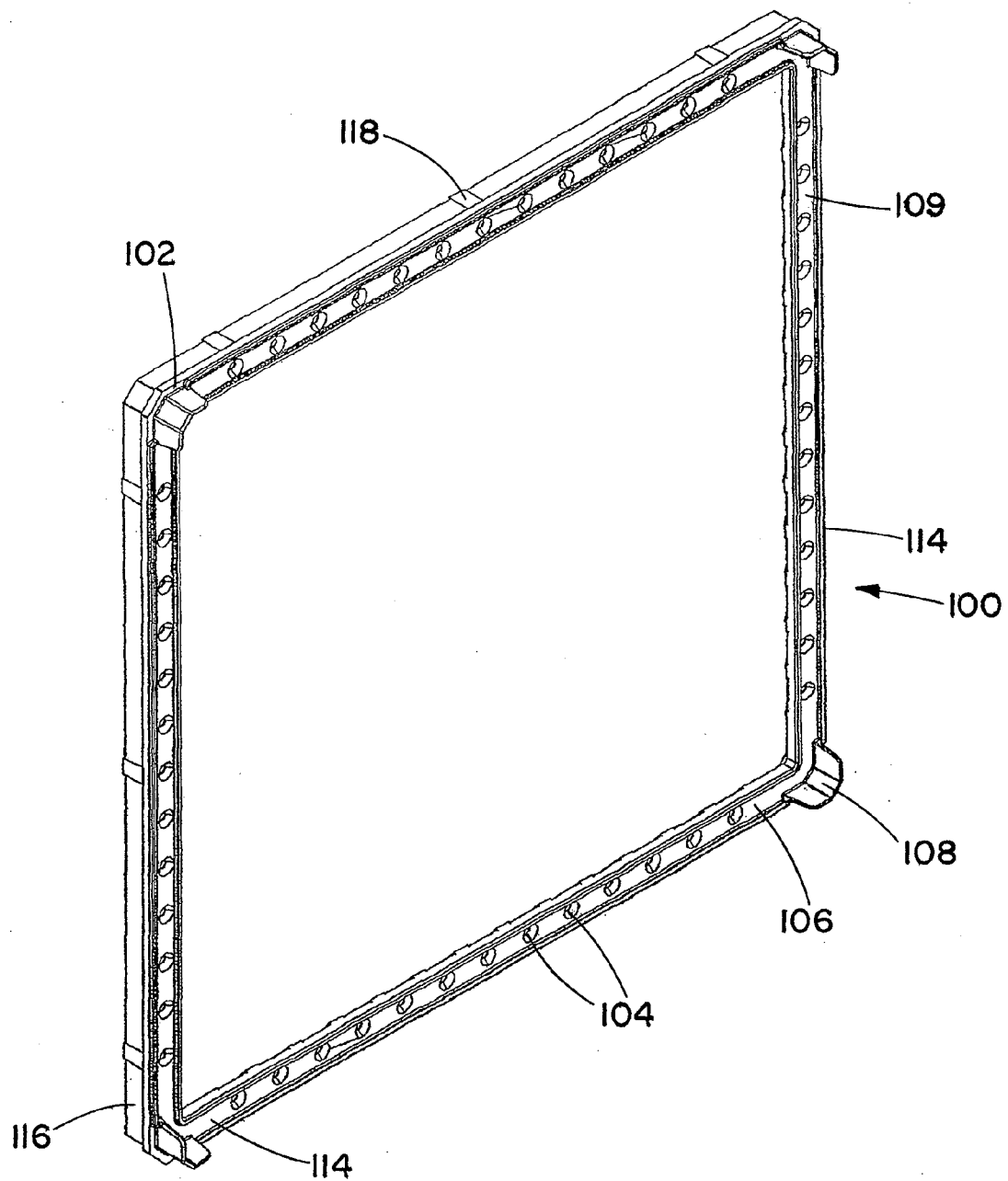
FIG. 9 is an isometric diagram illustrating an exemplary stiffening ring in accordance with aspects of the present invention.

Referring now to FIGS. 7-13, shown are various views of a generally annular stiffening ring 100. The stiffening ring 100 may be removable, or it may be integrally formed with the body 11. The stiffening ring 100 may be located at or near the opening 15 of the enclosure 10, as is shown in FIG. 7, depicting an exemplary enclosure with its door 16 removed. As shown, the stiffening ring may surround the opening 15 and be attached directly or indirectly to the body 11. For example, the stiffening ring may rest on a ledge 29 formed in the sidewalls 12 of the body 11. The outer perimeter 102 of the stiffening ring 100 is preferably the same shape as the interior surface 30 of the sidewalls 12. The stiffening ring 100 may provide extra support to the enclosure body 11 by acting as a stiffening member to the sidewalls 12. Further, the stiffening ring 100 may provide a means of locating and attaching electrical or other components or vertical mounting stiffeners 200.

The stiffening ring 100 may include a series of regularly spaced vertical holes 104 configured to accept screws or other fasteners for securing the top of a vertical mounting stiffener 200 to the stiffening ring 100. The vertical holes 104 may be countersunk or counterbored in order to accept a mechanical fastener such that the head of the mechanical fastener is flush with an upper side 109 of a top portion 114 of the stiffening ring 100.

The stiffening ring 100 may include corner ribs 108 disposed on the upper side 109 of the top portion 114 of the stiffening ring 100 which may increase the stiffness of the stiffening ring 100 at its corners, and may engage with the door 16, when in a closed position, to provide further stiffness to the enclosure 10 assembly.

Figure 10:
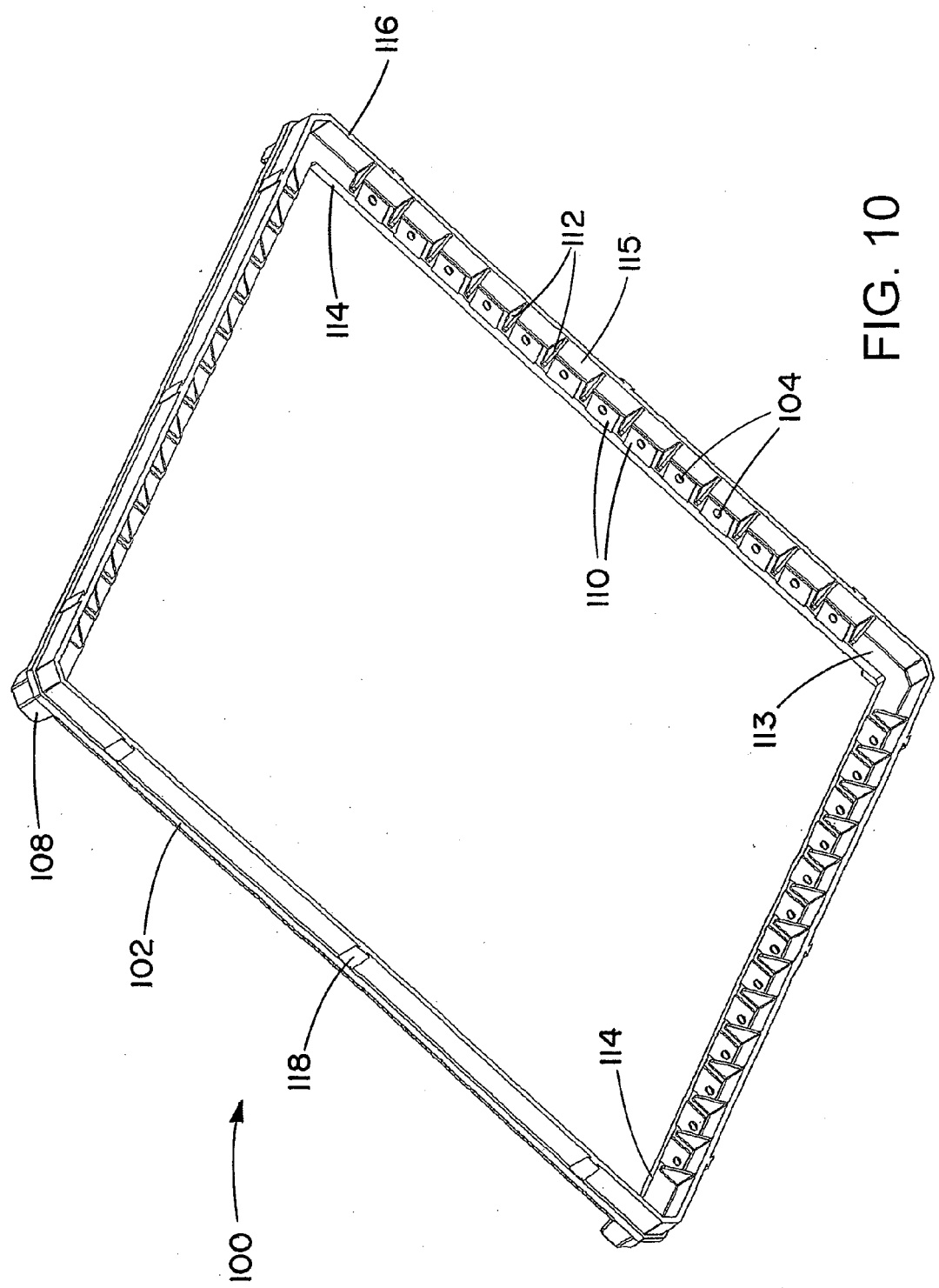
FIG. 10 is an isometric diagram illustrating an exemplary stiffening ring in accordance with aspects of the present invention.
Figure 12:
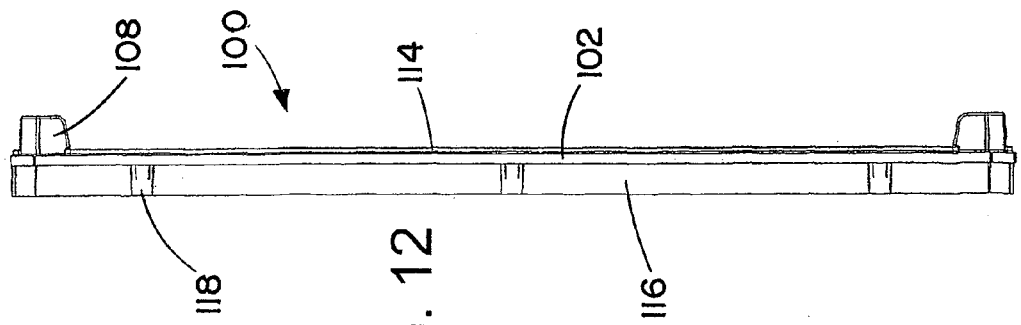
FIG. 12 is an orthographic side view illustrating an exemplary stiffening ring in accordance with aspects of the present invention.
Figure 11:
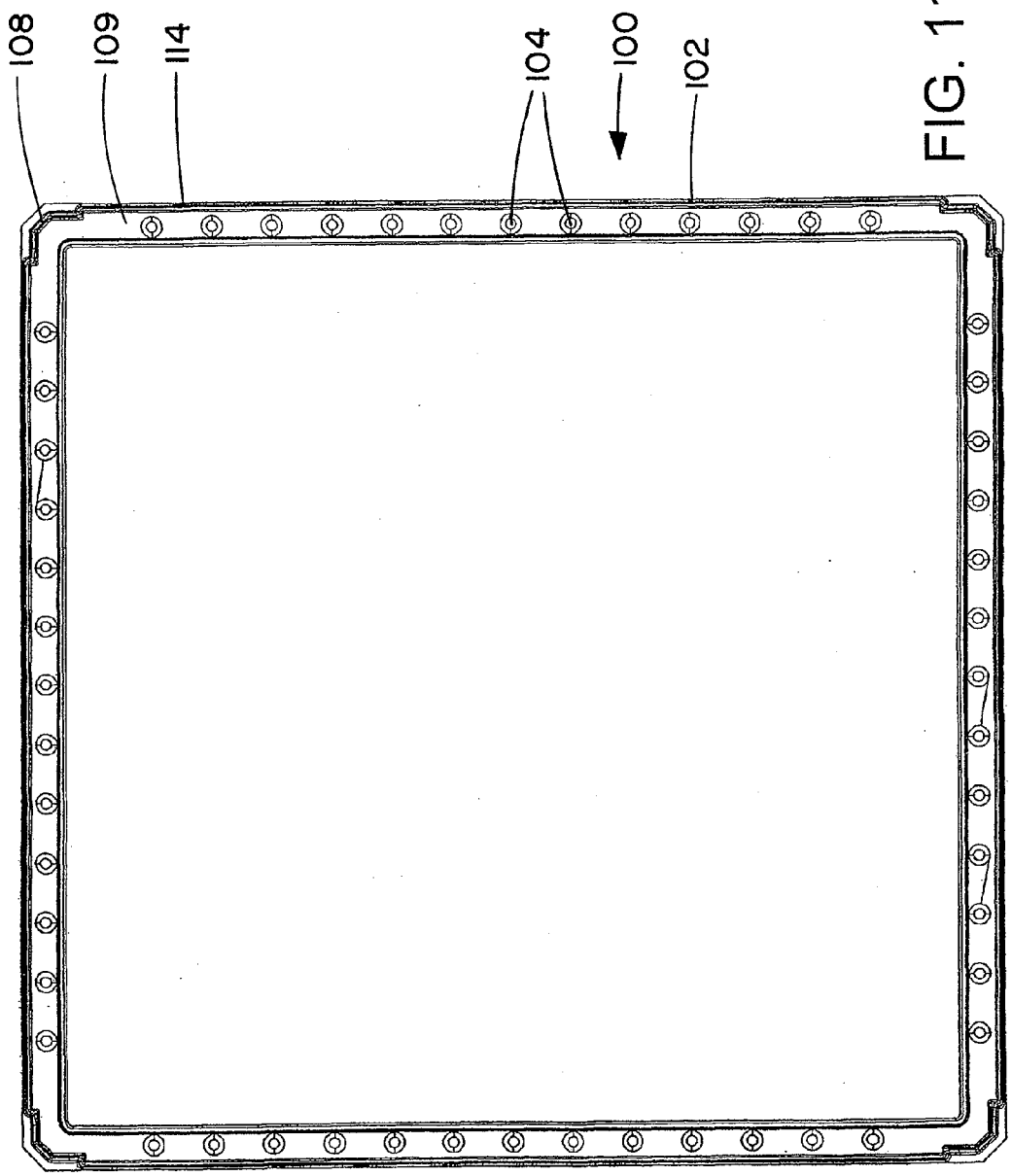
FIG. 11 is an orthographic top view illustrating an exemplary stiffening ring in accordance with aspects of the present invention.
Figure 13:
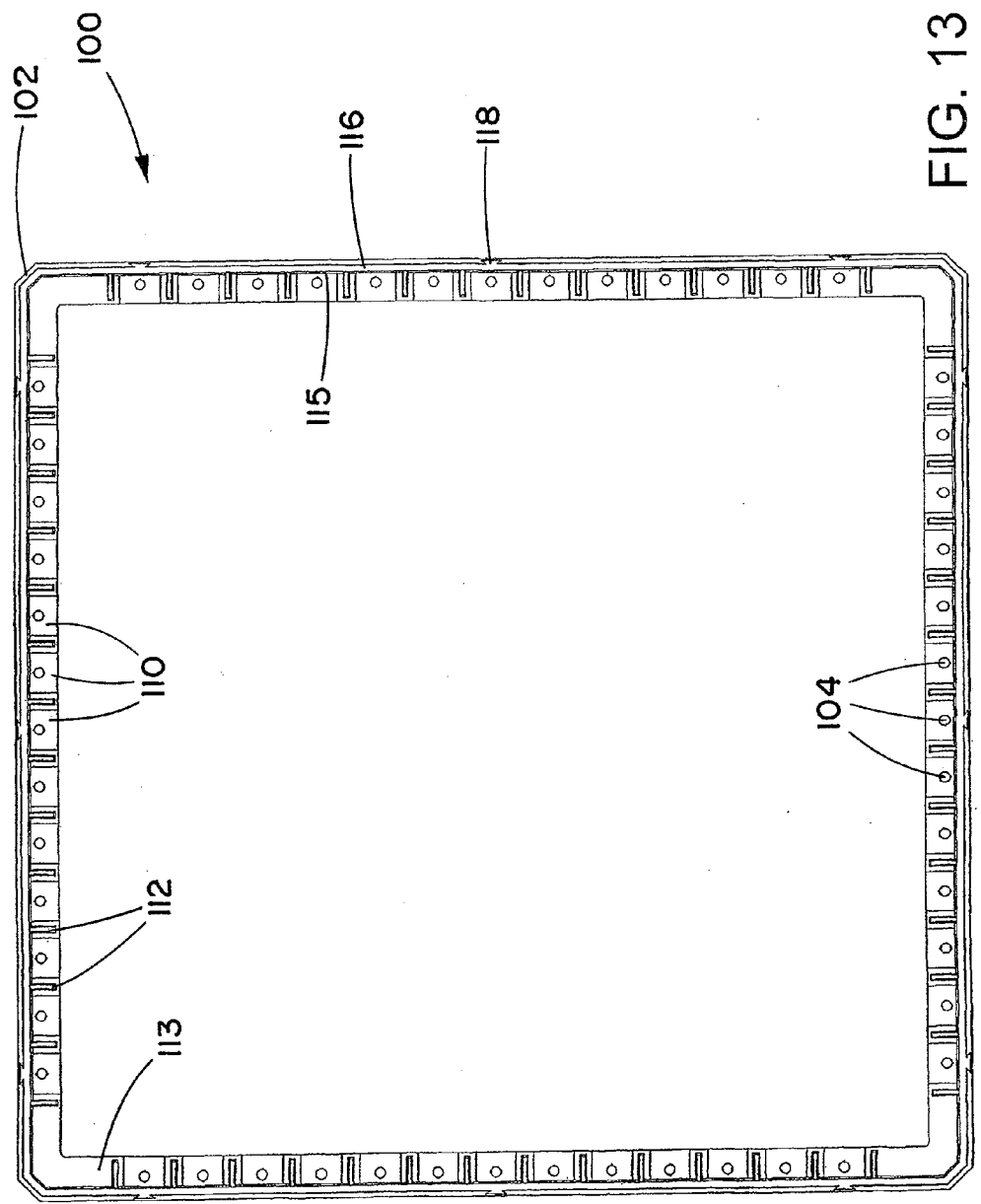
FIG. 13 is an orthographic bottom view illustrating an exemplary stiffening ring in accordance with aspects of the present invention.
Figure 14:
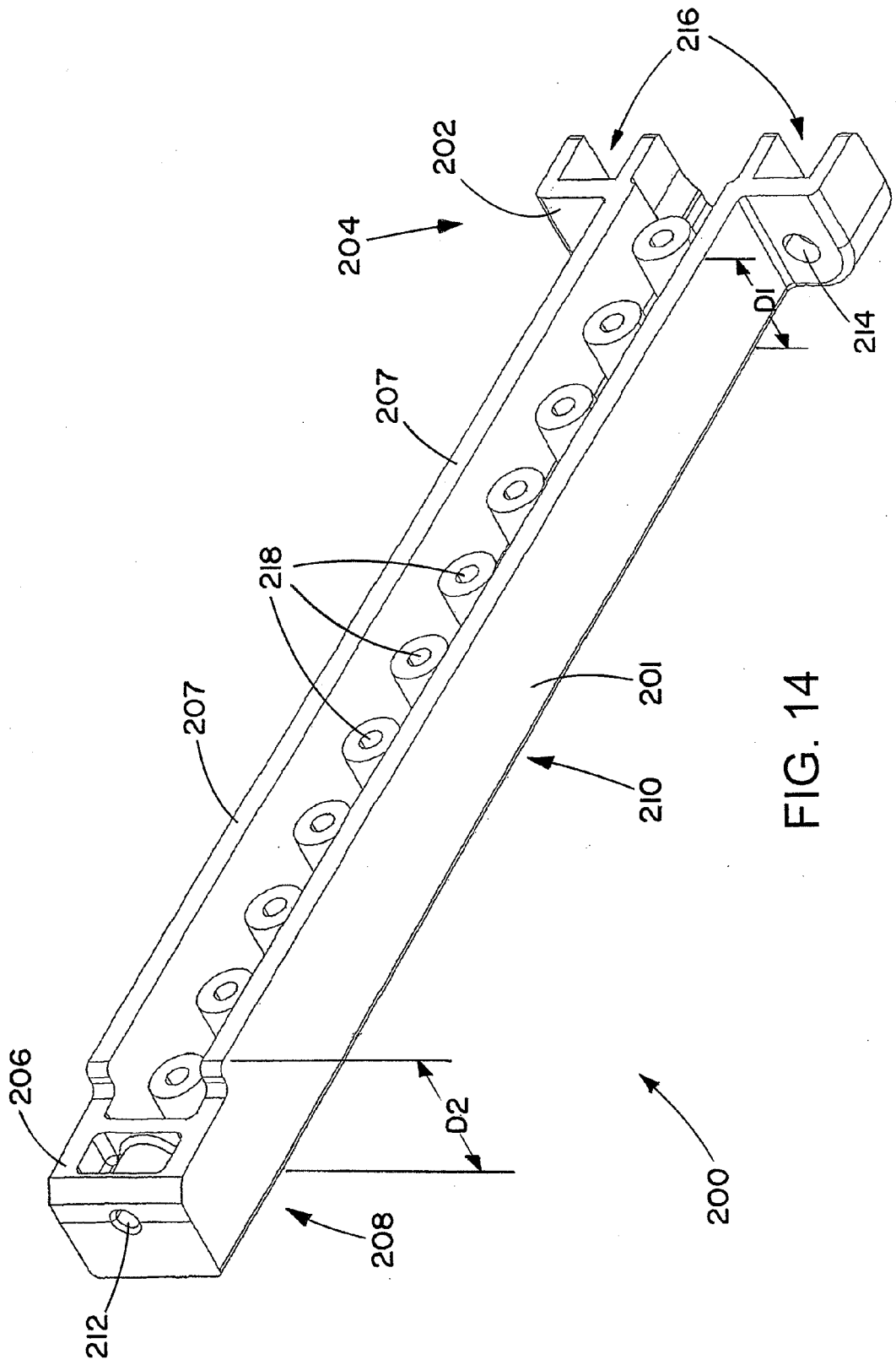
FIG. 14 is an isometric diagram illustrating an exemplary vertical mounting stiffener in accordance with aspects of the present invention.
Figure 15:
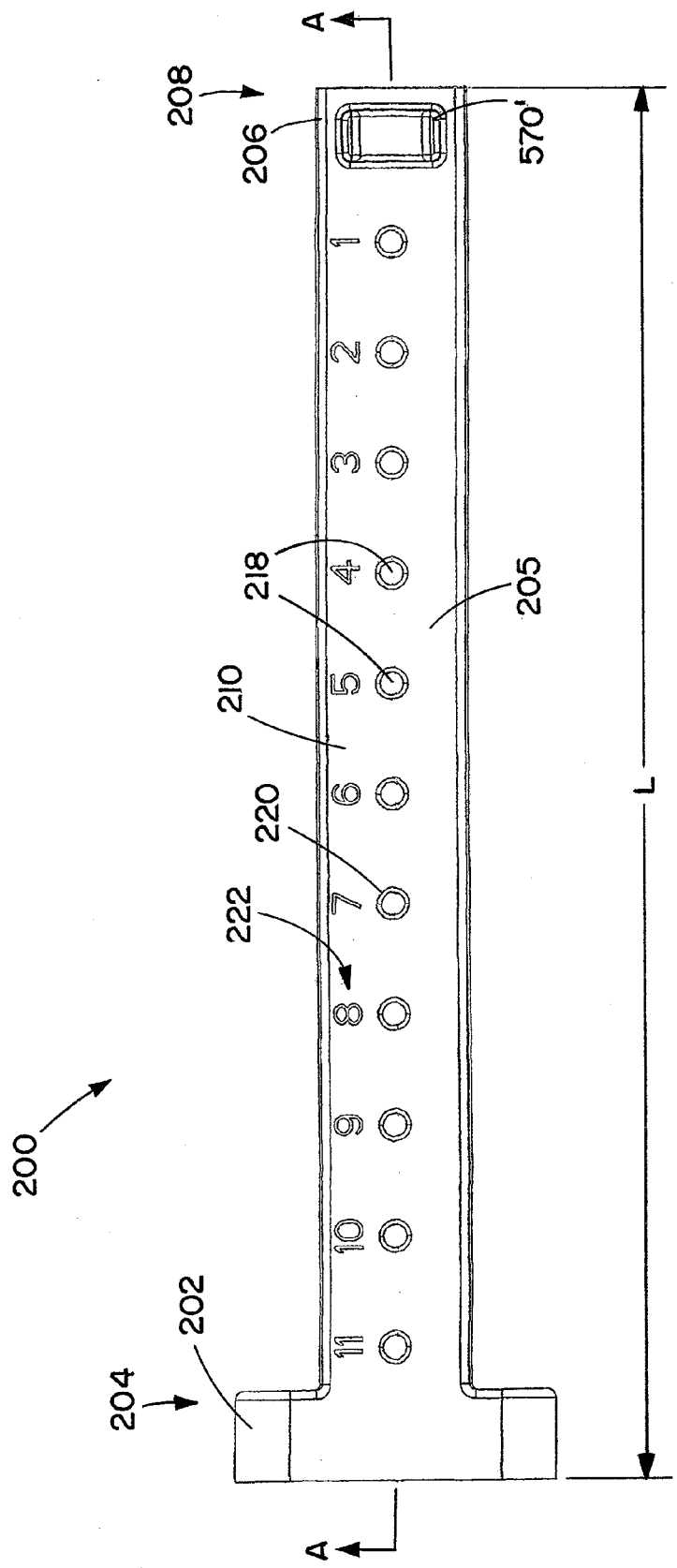
FIG. 15 is an orthographic front view illustrating an exemplary vertical mounting stiffener in accordance with aspects of the present invention.
Figure 19:
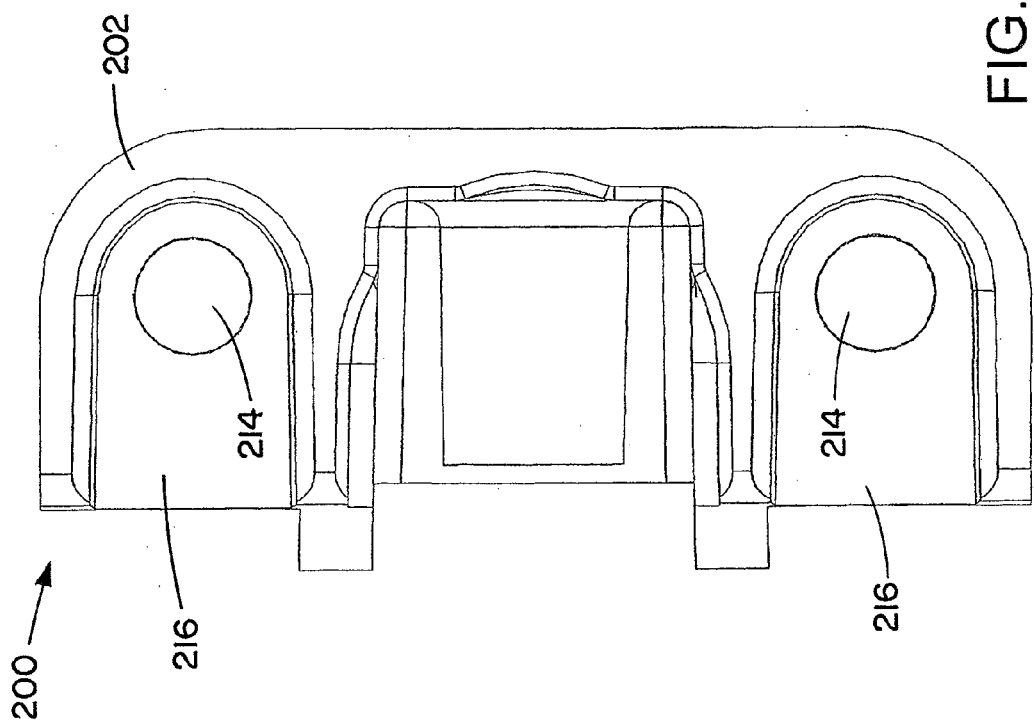
FIG. 19 is an orthographic bottom view illustrating an exemplary vertical mounting stiffener in accordance with aspects of the present invention.
Figure 18:
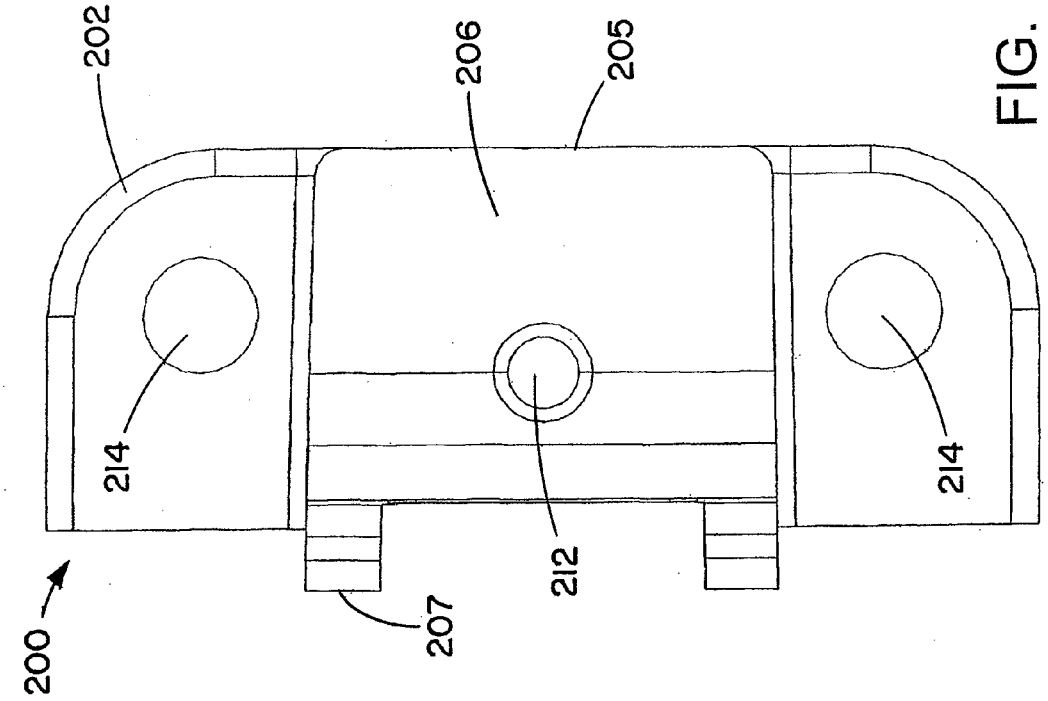
FIG. 18 is an orthographic top view illustrating an exemplary vertical mounting stiffener in accordance with aspects of the present invention.
Figure 20:
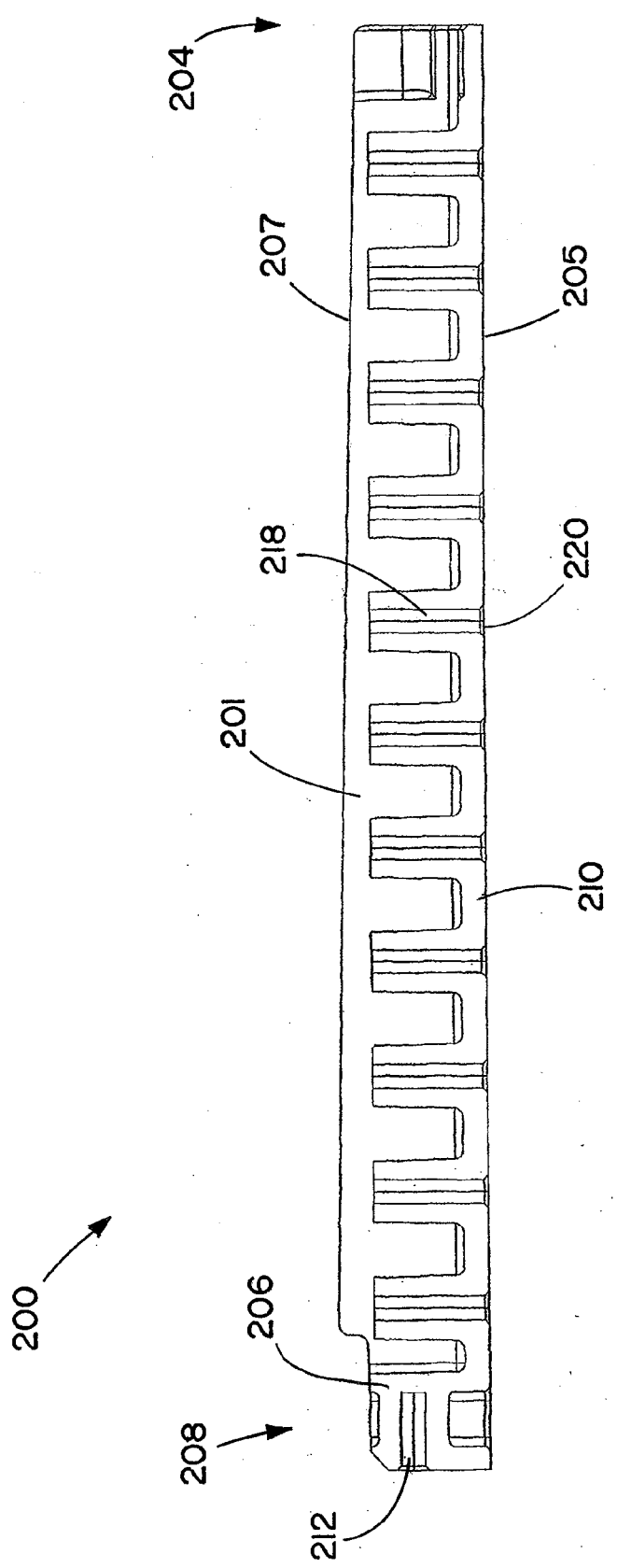
FIG. 20 is a cross-sectional view illustrating an exemplary vertical mounting stiffener in accordance with aspects of the present invention.
Figure 24:
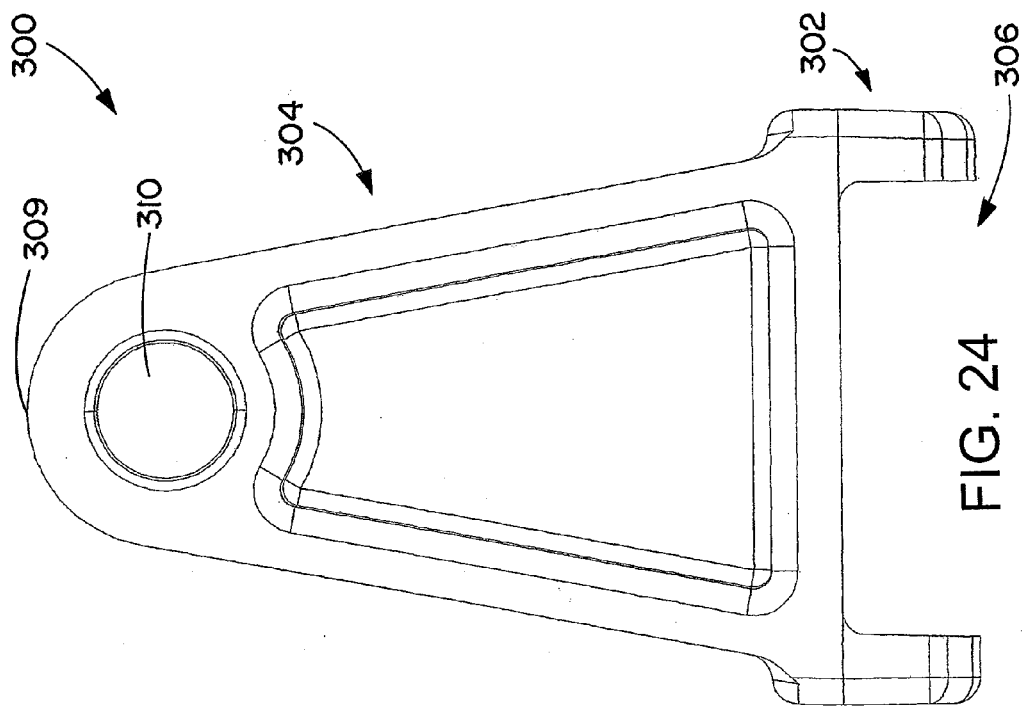
FIG. 24 is an orthographic top view illustrating an exemplary mounting bracket in accordance with aspects of the present invention.
Figure 23:
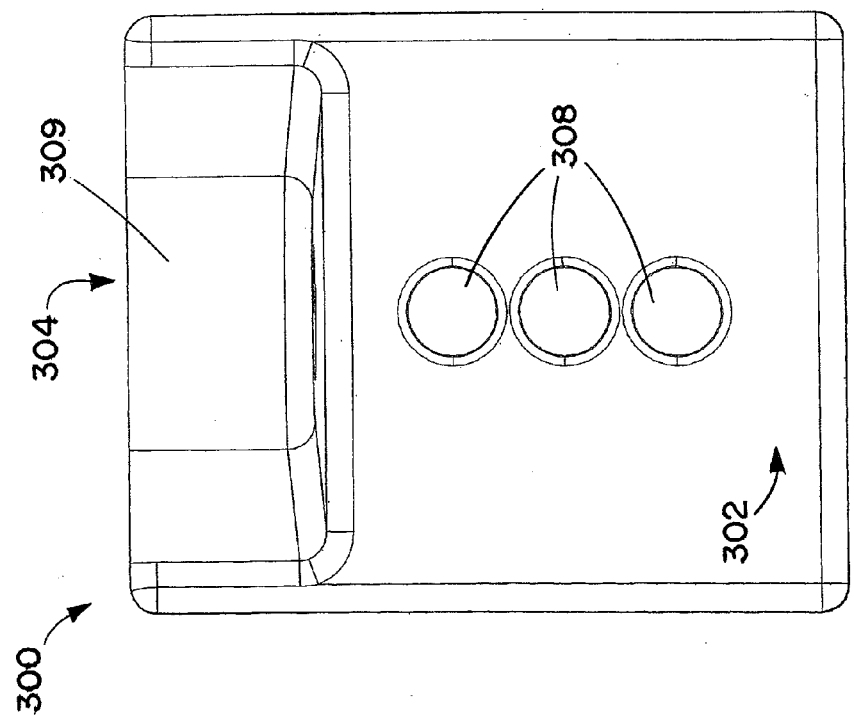
FIG. 23 is an orthographic front view illustrating an exemplary mounting bracket in accordance with aspects of the present invention.
Figure 26:
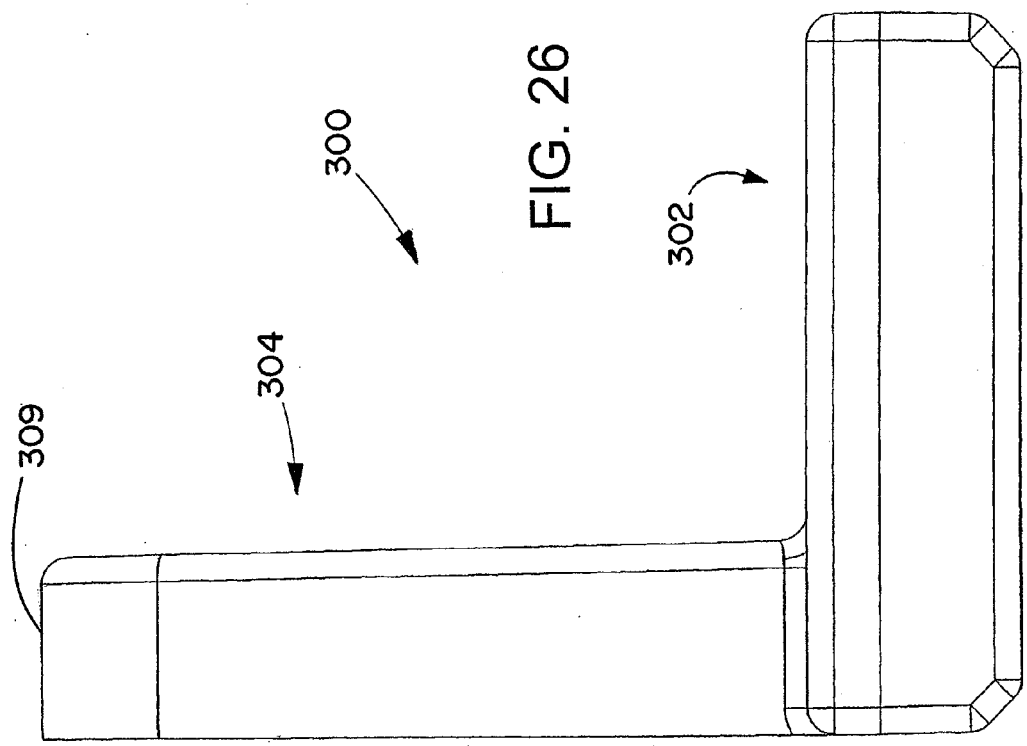
FIG. 26 is an orthographic side view illustrating an exemplary mounting bracket in accordance with aspects of the present invention.
Figure 25:
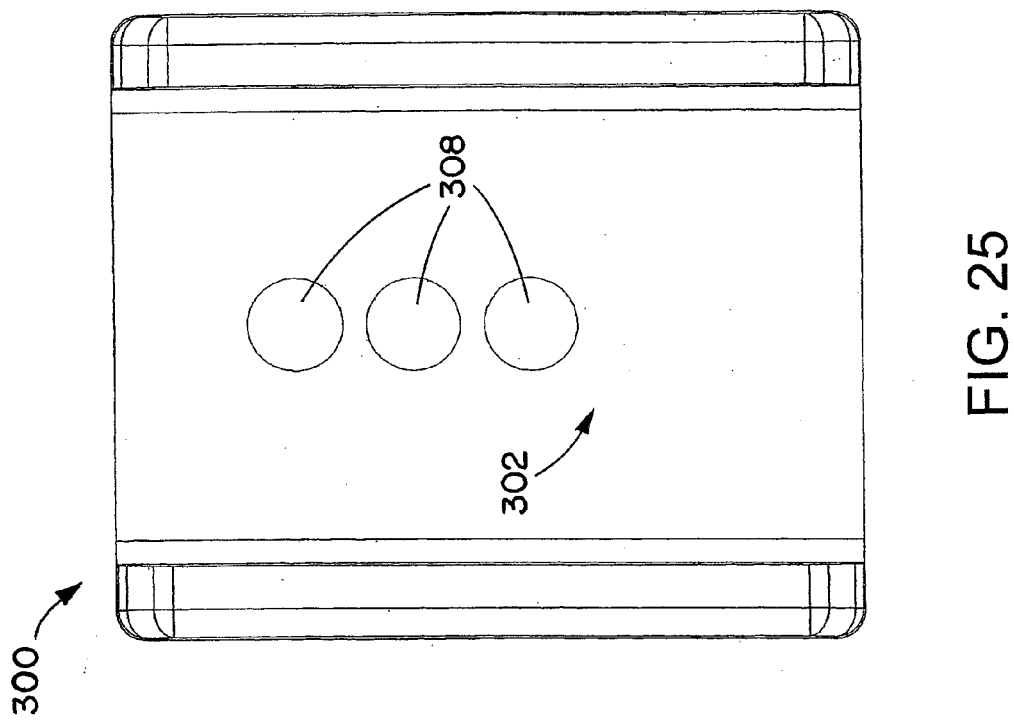
FIG. 25 is an orthographic back view illustrating an exemplary mounting bracket in accordance with aspects of the present invention.

As shown best in FIG. 10, the lower side 113 of the top portion 114 of the stiffening ring 100 may include a series of regularly space depressions 110 which may be centered around the vertical holes 104. The depressions 110 may be shaped to accept the top of the vertical mounting stiffeners 200, thereby providing a mechanism to align and provide torsional stability to the vertical mounting stiffeners 200. Further, the bottom of the stiffening ring 100 may include internal ribs 112 regularly disposed between the lower side 113 of the top portion 114 and an interior side 115 of a side portion 116 of the stiffening ring 100. These internal ribs 112 may add structural stability and may also be configured to provide additional torsional support to any adjacent vertical mounting stiffeners 200.

Finally, the stiffening ring 100 may include one or more tenons 118 disposed along an exterior side 119 of the side portion 116 of the stiffening ring 100 and configured to fit into mating mortises 32 (shown best in FIG. 7) formed in the sidewalls 12 of the enclosure body 11. The mortises 32 and tenons 118 are preferably dovetail shaped, but may take other forms as well. The mating of the mortise 32 and tenon 118 may provide a strong joint to link the stiffening ring 100 with the enclosure body 11, and provide a support to the stiffening ring 100, holding the stiffening ring 100 at the opening 15 of the enclosure 10. Alternatively or additionally, the stiffening ring 100 may be adhesively bonded or welded to the body 11.

Referring now to FIGS. 14-20, shown are views of a vertical mounting stiffener 200 in accordance with aspects of the present invention. The vertical mounting stiffener 200 may have a platform 202 located at a bottom end 204, a head 206 located at a top end 208, and a main shaft 210 extending therebetween. The vertical mounting stiffener may have a length L extending in a direction between the bottom end 204 and the top end 206, a width W perpendicular to the length L and extending in a direction between sidewalls 201, and a depth D perpendicular to the length L and width W and extending in a direction between a front 205 and a back 207. The vertical mounting stiffener 200 may be configured to provide further structural support to the enclosure 10 and to provide various locations along its length for direct or indirect attachment of electrical or other components. The vertical mounting stiffener 200 is preferably an integral, extruded plastic component (e.g., polycarbonate or the like), but may be constructed or formed from other materials and/or from several subcomponents.

The head 206 of the vertical mounting stiffener 200 may be shaped to fit in a depression 110 on the lower side 113 of the top portion 114 of the stiffener ring 100. The head may include a vertical aperture 212, configured to be aligned with a vertical hole 104 when fitted in a depression 110 of the stiffening ring 100, for receiving a mechanical fastener (not shown). The vertical aperture 212 may be threaded for engagement with the fastener, for example. Alternatively, for example, the fastener may be a self-tapping fastener, or may threadably engage with a nut on an interior side of the vertical mounting stiffener 200. As an alternative to a vertical aperture 212, for example, the head 206 may instead be provided with a mechanical fastening member (not shown) that links or mates with a complimentary feature (not shown) on the stiffening ring 100, or the vertical mounting stiffener 200 may be attached via an adhesive or by welding.

The platform 202 of the vertical mounting stiffener 200 may extend laterally outward from the main shaft 210 and may have one or more (preferably two) vertical apertures 214. The vertical apertures 214 may be sized and located to accept a mechanical fastener (not shown) that passes through the vertical aperture 214 into juxtaposed vertical apertures 34 located in the base 14 of the enclosure body 11 (shown best in FIG. 1). Further, the vertical apertures 34 in the base 14 of the enclosure body 11 may be formed in protrusions 36 therefrom which help to locate the vertical mounting stiffener 200 by engaging in complimentary recesses 216 formed in the bottom of the platform 202. The complimentary recesses 216 may be shaped, for example, like a hole: extending from the bottom end 204 into the platform. Alternatively, as shown in the figures, the complimentary recesses 216 may extend through the bottom end 204 and through the back 207. This second configuration makes insertion of the vertical mounting stiffener 200 into the enclosure easier, especially if the stiffening ring 100 is already installed, or is permanently attached. The vertical apertures 214 may be threaded for engagement with the fastener, for example. Alternatively, for example, the fastener may be a self-tapping fastener, or may threadably engage with a nut. As an alternative to the vertical apertures 214, for example, the platform 202 may instead be provided with a mechanical fastening member (not shown) that links or mates with a complimentary feature (not shown) on the base 14, or the vertical mounting stiffener 200 may be attached via an adhesive or by welding.

The main shaft 210 may include a plurality of spaced, generally horizontal apertures 218. Although the horizontal apertures 218 may be aligned in any orientation in a generally horizontal plane, they are preferably parallel to each other, and are preferably oriented with their main opening 220 directed towards the interior of the enclosure 10 when the vertical mounting stiffener is attached to the stiffener ring 100 and the base 14. Each horizontal aperture 218 may be sized to accept a mechanical fastener (for example, a screw, bolt, deformable plastic pin, or the like) and may be threaded for engagement with a threaded fastener, for example. Alternatively, for example, the fastener may be a self-tapping fastener, or may threadably engage with a nut on an opposite side of the vertical mounting stiffener 200. The horizontal apertures 218 may be regularly or irregularly spaced. Further, any number of horizontal apertures 218 may be provided and may have any spacing, but are preferably spaced by about 0.5-1.0 inches, and are more preferably spaced about 0.75 inches apart. Further, the horizontal apertures 218 may be aligned along the center of the main shaft 210, as shown, or may be staggered along its length.

The main shaft 210 may also include a plurality of markings 222 associated (for example, by being adjacent to) with corresponding horizontal apertures 218. These markings 222 may be any type that will function to identify an aperture 218 as corresponding to one or more other apertures 218 on one or more other vertical mounting stiffeners 200, but are preferably alphanumeric characters. The correspondence between a horizontal aperture 218 and one or more other horizontal apertures 218 may be, for example, their equal heights above the base 14, and may be important, for example, to align components mounted (directly or indirectly) on the vertical mounting stiffeners 200.

The main shaft 210 may taper from a relatively narrow depth D1 near the platform 202 to a relatively deep depth D2 near the head 206, causing the sidewalls 201 to be greater in extent near the head 206 than near the platform 202. The taper may increase the stiffness near the stiffening ring 100. The main shaft 210 (except for the apertures 218) may be solid, or may be hollowed out as depicted in the figures in order to reduce material use, weight, and curing time. Further, a hollowed out main shaft 210 may decrease the possibility of hidden internal voids during production, therefore increasing the possibility for quality control.

Referring now to FIGS. 21-26, shown is an exemplary mounting bracket 300. The mounting bracket 300, as shown best in FIG. 26 may have a generally "L-shaped" cross-section, although other shapes are also possible (e.g., a T-shape or the like). The mounting bracket 300 may have a stiffener portion 302 and a component portion 304. The stiffener portion 302 may be configured for attachment to a vertical mounting stiffener 200, while the component portion 304 may be configured for attachment to a component to be enclosed by the enclosure 10.

The stiffener portion 302 may be generally rectangular and configured to engage with and preferably fit over and at least partially around the vertical mounting stiffener 200, preferably by means of a stiffener groove 306. The stiffener groove 306 can thus slidably engage with the vertical mounting stiffener 200, and prevent twisting of the mounting bracket 300 on the vertical mounting stiffener 200, thus keeping the component portion 304 in the correct orientation (preferably in a generally horizontal plane).

The stiffener portion 302 may include one or more stiffener apertures 308 sized for accepting a mechanical fastener for attaching the mounting bracket 300 to the vertical mounting stiffener 200. The one or more stiffener apertures 308 may be regularly or irregularly spaced, and may be spaced at a distance different from the spacing of the horizontal apertures 218 of the vertical mounting stiffener 200. For example, three stiffener apertures 308 may have a relatively narrow spacing and thus provide a greater number of possible positions and therefore a greater precision in positioning the mounting bracket 300 along the vertical mounting stiffener 200. In other words, the possible positions for a mounting bracket 300 along a vertical range in the enclosure may be the number of horizontal apertures 218 on a vertical mounting stiffener 200 multiplied by the number of stiffener apertures 308 on a mounting bracket 300.

The component portion 304 may be any appropriate shape, but in one preferred embodiment is generally triangular with a base of the triangle connected to the stiffener portion 302 and a tip 309 (preferably rounded) of the triangle being at an extreme end away from the stiffener portion 302. The component portion 304 may include a component aperture 310 preferably situated at or near the tip 309. The component aperture 310 may be sized to accept a mechanical fastener (for example, a screw, bolt, deformable plastic pin, or the like) for securing a component to the component mount, and the component aperture 310 may be threaded for engagement with a threaded fastener, for example. Alternatively, for example, the fastener may be a self-tapping fastener, or may threadably engage with a nut on an opposite side of the component portion 304.

Figure 27:
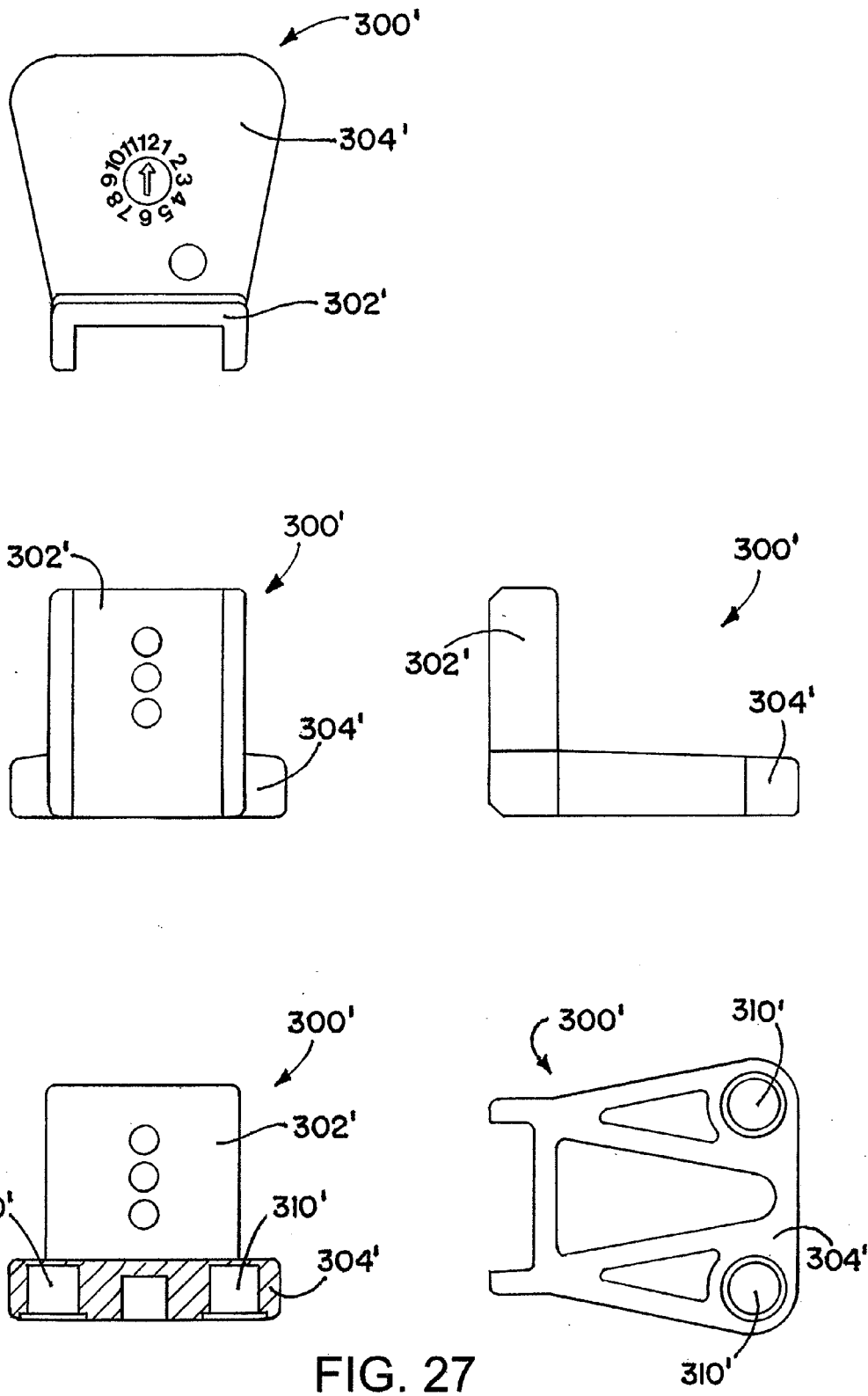
FIG. 27 is an orthographic view of an exemplary mounting bracket in accordance with aspects of the present invention.

Turning now to FIG. 27, shown is an alternative preferred embodiment of a mounting bracket 300' in orthographic projections. The mounting bracket 300' shares many features with the mounting bracket 300 previously presented, and similar descriptions are omitted for brevity. Of note, for example, is the component portion 304', which expands outward from the stiffener portion 302', instead of forming a triangle shape as illustrated in the first exemplary embodiment. The component portion 304' may include, for example, two component apertures 310'. These component apertures may have the same spacing as the vertical apertures 34 located in the base 14 of the enclosure body 11 (shown best in FIG. 1). Therefore, any component made to be attached directly to the base 14 may instead be attached to elevated mounting brackets 300', thus allowing components to be offset from the base. For example, a plurality of components may be mounted onto mounting brackets 300' with the components being parallel to each other at successive heights along one or more vertical mounting stiffeners 200.

Figure 28:
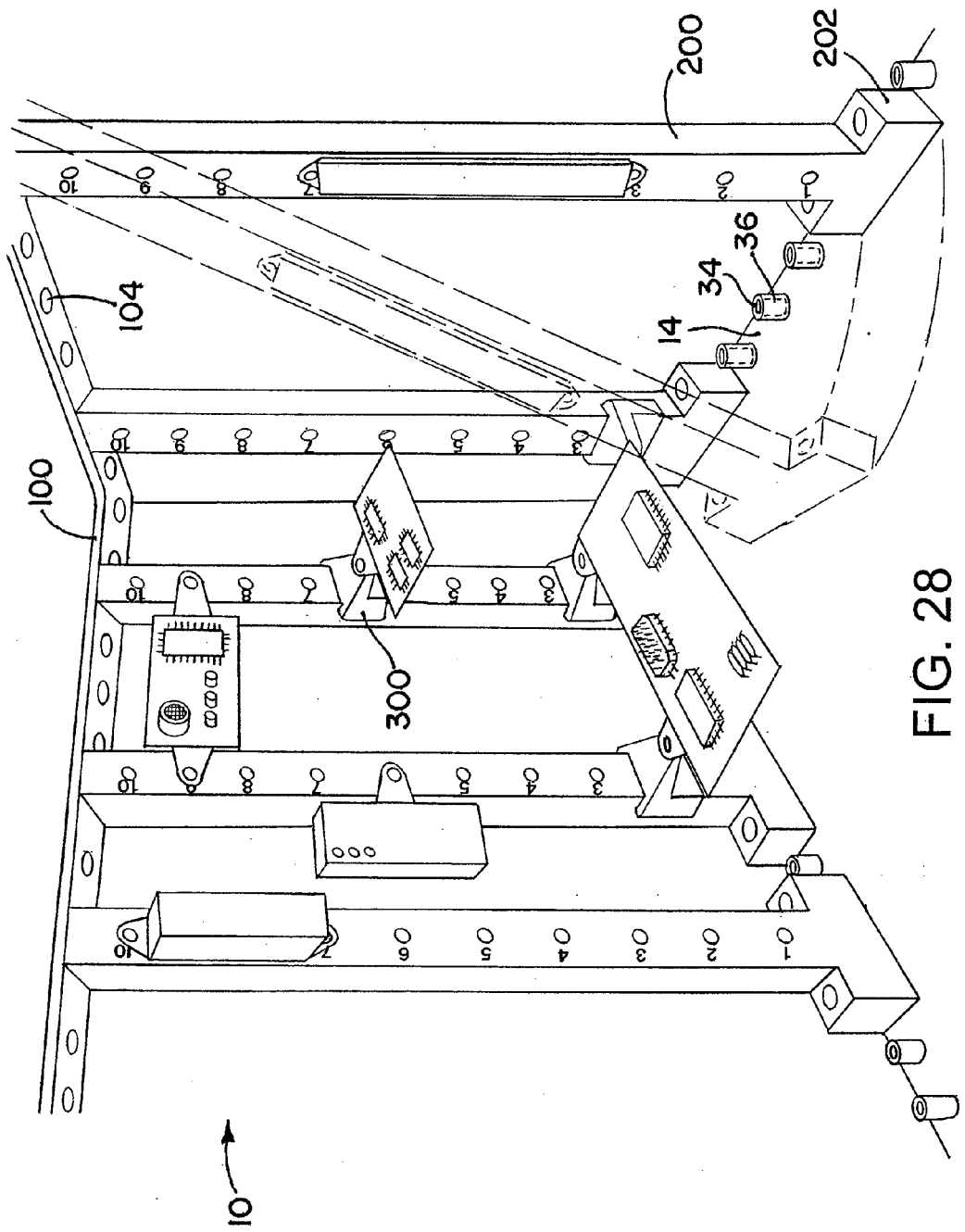
FIG. 28 is an illustration of the interior of an exemplary enclosure in accordance with aspects of the present invention and depicts an enclosure with components attached directly and indirectly to various locations along vertical mounting stiffeners which are, in turn, attached to various locations of the stiffening ring around the periphery of the enclosure.

Turning now to FIG. 28, shown is an illustration depicting the interior of an exemplary enclosure viewed from the inside. As shown, a plurality of vertical mounting stiffeners 200 may be disposed about the perimeter of the enclosure and attached to the base 14 via vertical apertures 34 in the protrusions 36 and to the stiffening ring 100 via vertical holes 104. Further, various types and shapes of components may be attached directly or indirectly (e.g., by mounting brackets 300, 300') to these vertical mounting stiffeners 200. Some components may be attached to more than one vertical mounting stiffener 200.

Components may be attached to the vertical mounting stiffeners 200 using various methods. For example, a component may first be attached directly to a vertical mounting stiffener 200. The vertical mounting stiffener 200 may then be inserted into the enclosure 10, for example, by pivoting the platform 202 onto the protrusions 36, as is depicted with ghost lines in FIG. 28. The complimentary recesses 216 may be open on the back 207, thus allowing easy insertion without removal of the stiffening ring 100. Alternatively, a component may be attached to a vertical mounting stiffener 200 already installed in the enclosure. Further, a component may be attached to a mounting bracket 300, 300' which is already attached to a vertical mounting stiffener 200 (either installed or not installed in the enclosure). Still further, a component may be attached directly to an already installed vertical mounting stiffener 200. Finally, a stiffening ring 100 may be installed first, intermediately, or after all the components and vertical mounting stiffeners 200 are installed in at least the base 14 of the enclosure 10. These mounting methods are given only as example illustrations, and other combinations may be possible and desirable and are within the scope of the present disclosure.

Turning now to FIGS. 29-33, shown are various exemplary enclosures having an interior latchable function.

Figure 29:
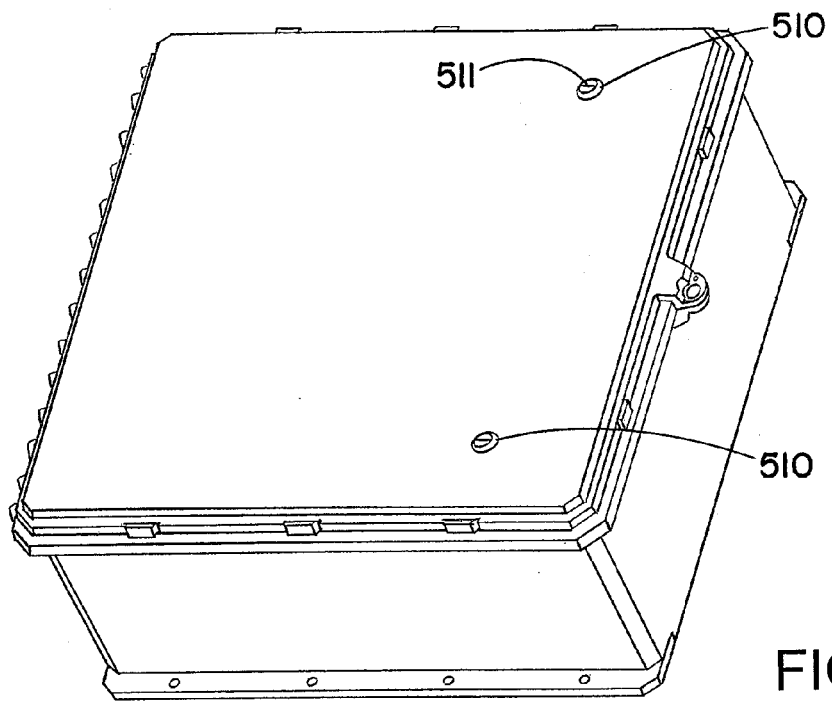
FIG. 29 is a perspective view of an exemplary enclosure including a locking assembly.

FIG. 29 shows an exterior view of an enclosure with two locking assemblies 510 which are rotatably coupled to the cover and pass therethrough. The locking assemblies 510 of FIG. 29 include a slot 511 engageable with, for example, a flat-head screwdriver in order to rotate the locking member to respectively engage and disengage the locking member with an interior latch. However, it is contemplated that the exterior portion of the locking assemblies 510 may take other forms and may include handles of various sizes and shapes, or may, for example require different shaped tools to rotate, including, for example, a key.

Figure 30:
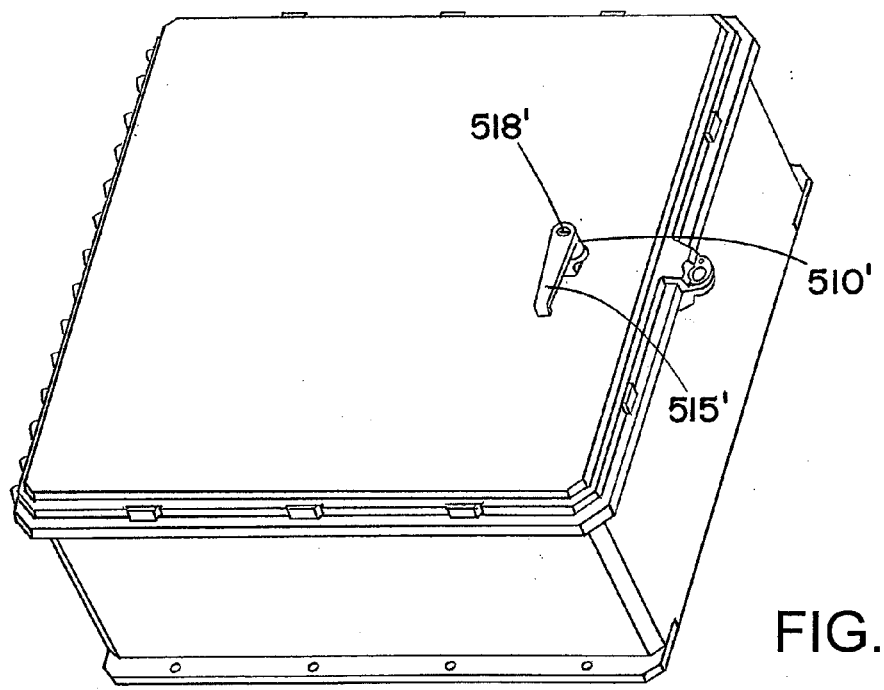
FIG. 30 is a perspective view of another exemplary enclosure including a locking assembly.

FIG. 30 shows another exemplary enclosure with a central locking assembly 510' including a handle 515'. The central locking assembly 510' may include a lock 518' that accepts a key (not shown) and respectively allows and prevents rotation of the locking assembly 510'.

Figure 31:
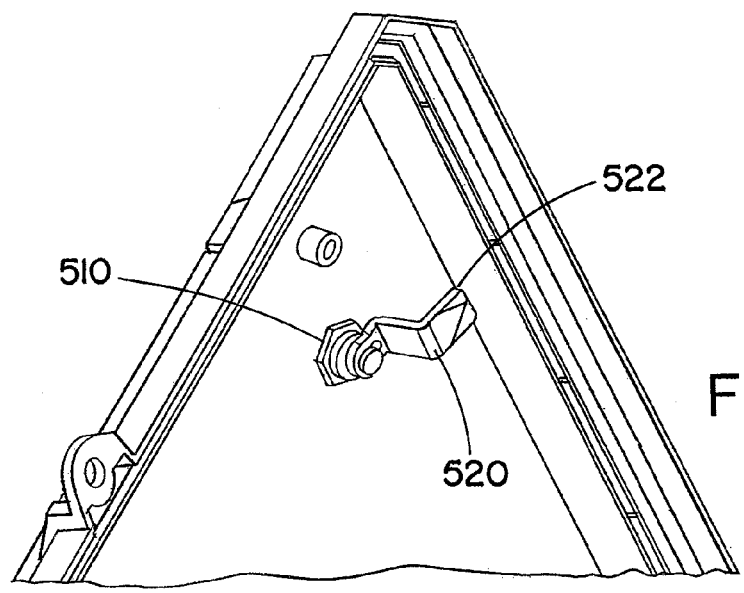
FIG. 31 is a perspective view of an interior of an exemplary enclosure cover having a locking assembly.

FIG. 31 shows the inside of the cover and the inside portion of the locking assembly 510. The locking assembly 510 may include, as shown, a generally L-shaped locking member 520 for engaging with a latch. The locking member 520 may also include rounded or sloped locking surface 522 in order to increase to likelihood of catching the latch. Further, this locking surface 522 may act as a cam, drawing the cover closed and providing a tighter seal to help protect the contents of the enclosure from the environment.

Figure 32:
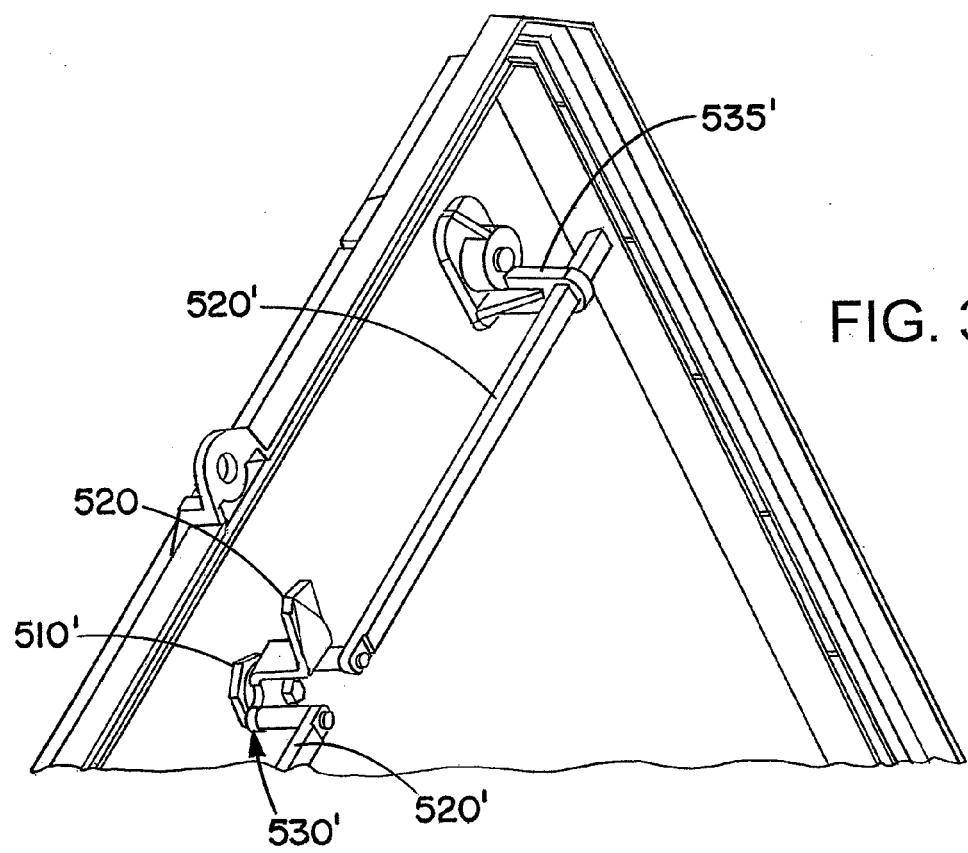
FIG. 32 is a perspective view of an interior of another exemplary enclosure cover having a locking assembly.

FIG. 32 shows the inside of the cover and the inside portion of the lock assembly 510'. The locking assembly 510' may include a linkage mechanism 530'. The locking members 520' are rotatably coupled to the linkage mechanism 530' and are slidably coupled to the cover via brackets 535'. Therefore, when the locking assembly is rotated (for example, by rotating the handle 515') the linkage mechanism 530' translates the rotating motion into linear motion of the locking members 520'. The locking assembly 510' also includes a third locking member 520 rigidly coupled to the linkage mechanism. The third locking member 520 may operate similarly to those previously described in reference to FIG. 31.

Figure 33:
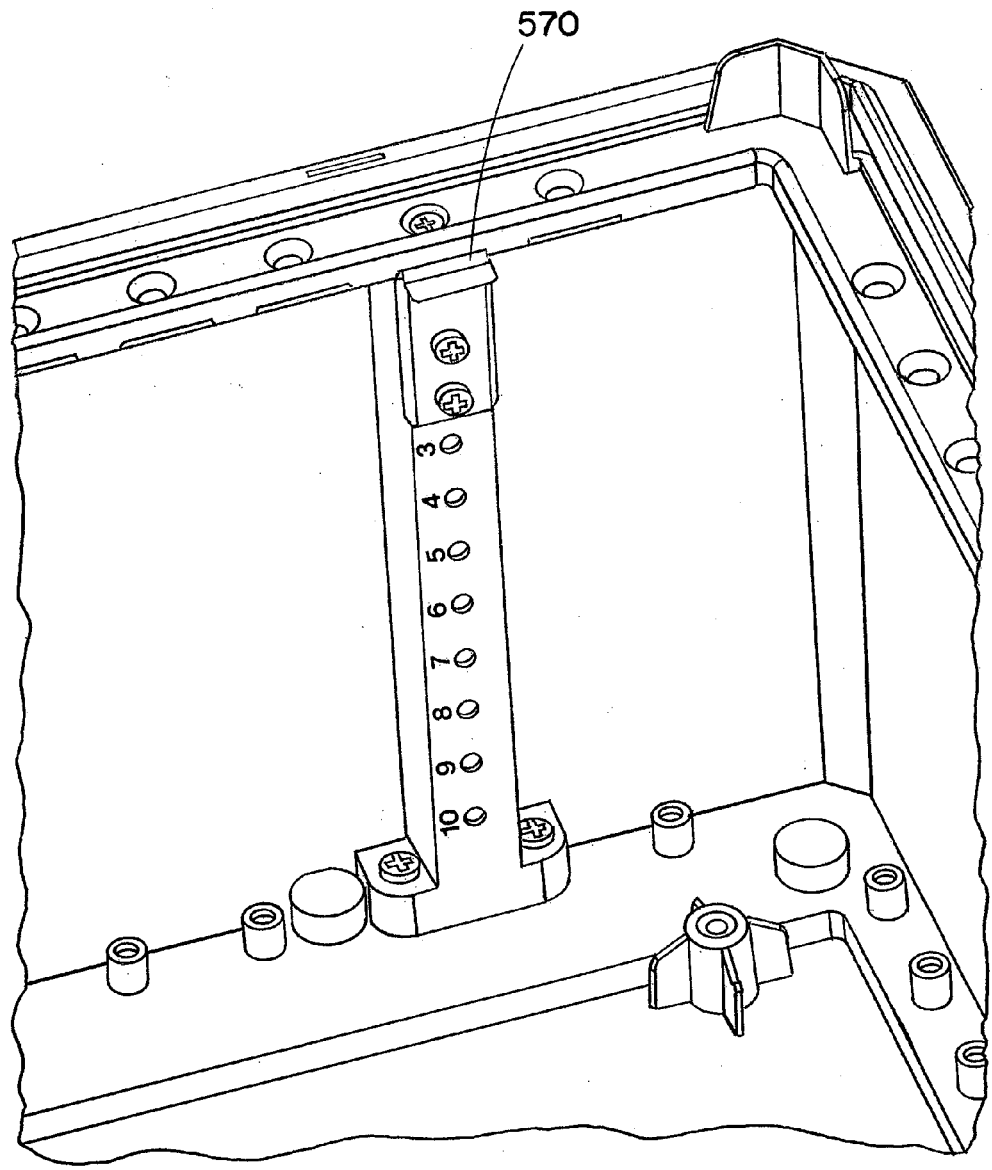
FIG. 33 is a perspective view of an interior of an exemplary enclosure body having a latch mounted to a vertical mounting stiffener.

FIG. 33 shows an exemplary latch 570. The latch 570 may be, for example, an L-shaped bracket that may be removably attached to a vertical mounting stiffener. Such a mounting provides rigidity, making forceable opening of the cover more difficult by preventing deformation of the enclosure. Preferably, the bracket is metal or another wear-resistant and strong material.

Alternatively, a latch recess 570' formed directly in a vertical mounting stiffener (shown in FIG. 15) may be used to secure a locking member. Optionally, this recess 570' may be lined with a wear-resistant material to lengthen the operational life of the latch.

Although specific embodiments of the lock function have been shown for illustrative purposes, it is understood that features from the examples may be combined or substituted with each other and their equivalents. Further, any number of locking members and latches may be implemented in a single enclosure.

Any fastener used in an embodiment of the present invention may comprise a self-tapping set screw which engages the inside wall of the holes or apertures when inserted therein. Alternatively, the holes and apertures may be threaded to receive a particular type and/or size threaded fastener. Alternatively, the holes and apertures may be sized and shaped to accept a plastic or other deformable pin fastener. Any combination of the above types of fasteners and corresponding holes and apertures is also possible.

Although the invention has been shown and described with respect to certain preferred embodiments, it is understood that equivalents and modifications will occur to others skilled in the art upon the reading and understanding of the specification. The present invention includes all such equivalents and modifications, and is limited only by the scope of the following claims.

What is claimed is:

1. An enclosure assembly for enclosing electrical components, comprising:
   a body including a base and a plurality of sidewalls integrally formed with the base, wherein the plurality of sidewalls define an opening and extend from the base in a first direction perpendicular to the base;
   a cover;
   one or more mounting stiffeners coupled to the body in a spaced relationship from corners of the body and comprising a main shaft including a plurality of generally parallel apertures spaced along a length of the main shaft in the first direction configured to receive fasteners for mounting components thereon, a platform extending laterally outward from both sides of the main shaft in a second direction perpendicular to the first direction and including one or more platform apertures configured to receive a platform fastener, and a head including a head aperture configured to receive a head fastener;
   a unitary stiffening ring including a generally annular top portion having a planar extent with an inner and outer periphery, the inner periphery defining an opening that corresponds with the opening of the body, a first side, a second side, and a plurality of spaced holes extending through the top portion configured to accept the head fasteners to secure the stiffening ring to the head of the one or more mounting stiffeners through at least one of the plurality of spaced holes, wherein the stiffening ring is configured to be secured at least partially within the opening and at or near the opening to provide structural support when coupled to the body; and
   one or more latches coupled to at least one of the apertures of the one or more mounting stiffeners and adjacent to the cover,
   wherein the cover includes respective locking members movable to engage with the one or more latches for locking the cover to the body, and
   wherein the one or more mounting stiffeners are rigid, thereby providing structural support when coupled to the body.

2. The enclosure assembly of claim 1, wherein the stiffening ring includes a generally annular side portion extending from the second side of the top portion from the outer periphery in a second direction opposite the first direction and perpendicular to the top portion and having a first side and an second side.

3. The enclosure assembly of claim 1, wherein the one or more latches comprise an L-shaped bracket mounted to the one or more mounting stiffeners.

4. The enclosure assembly of claim 3, wherein the L-shaped bracket is metal.

5. The enclosure assembly of claim 1, wherein the one or more latches are removable.

6. The enclosure assembly of claim 1, wherein the cover includes a handle rotatably mounted to an exterior of the cover, the handle rigidly coupled to a linkage mechanism, the locking members rotatably coupled to the linkage mechanism and slidably coupled to the cover.

7. The enclosure assembly of claim 1, wherein the one or more latches comprise a recess formed in the one or more mounting stiffeners.

8. The enclosure assembly of claim 1, further comprising a lock configured to prevent movement of the locking members when in a locked position and configured to allow movement of the locking members when in an unlocked position.

9. The enclosure assembly of claim 1, wherein the locking members include a cam surface.

10. The enclosure assembly of claim 2, wherein the stiffening ring further includes a plurality of ribs having a first portion connected to the second side of the top portion and a second portion connected to the second side of the side portion.

11. The enclosure assembly of claim 10, wherein the second side of the top portion includes a plurality of spaced depressions, each depression configured to receive one of the one or more mounting stiffeners to align the mounting stiffener with the second side of the top portion, and wherein each depression is centered around one of the spaced holes extending through the top portion.

12. The enclosure assembly of claim 2, wherein the stiffening ring further includes a plurality of corner ribs extending from the first side of the top portion in the first direction and perpendicular to the top portion for providing stiffness to the stiffening ring and for engaging the cover.

13. The enclosure assembly of claim 2, wherein the stiffening ring includes a plurality of tenons on the first side of the annular side portion for mating with corresponding moritses formed in the side walls of the body.

* * * * *